(12) United States Patent
Banba

(10) Patent No.: US 6,956,435 B2
(45) Date of Patent: Oct. 18, 2005

(54) VARIABLE GAIN DIFFERENTIAL AMPLIFIER AND MULTIPLICATION CIRCUIT

(75) Inventor: Seiichi Banba, Oogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/107,738

(22) Filed: Apr. 18, 2005

(65) Prior Publication Data

US 2005/0179494 A1  Aug. 18, 2005

Related U.S. Application Data

(62) Division of application No. 10/810,833, filed on Mar. 29, 2004, which is a division of application No. 10/305,359, filed on Nov. 27, 2002.

(30) Foreign Application Priority Data

Nov. 29, 2001 (JP) .............................. 2001-363753
Nov. 29, 2001 (JP) .............................. 2001-363754

(51) Int. Cl.[7] .............................................. H03F 3/45
(52) U.S. Cl. .................................... 330/254; 330/252
(58) Field of Search ......................... 330/69, 254, 252, 330/261; 327/359

(56) References Cited

U.S. PATENT DOCUMENTS

| | | | |
|---|---|---|---|
| 5,210,504 A | 5/1993 | Yagita et al. | |
| 5,563,545 A | 10/1996 | Scheinberg | |
| 5,650,747 A | 7/1997 | Chen | |
| 5,777,513 A | 7/1998 | Guyot | |
| 5,828,265 A | 10/1998 | Mensink et al. | |
| 5,907,260 A | 5/1999 | Takeuchi et al. | |
| 6,181,922 B1 | 1/2001 | Iwai et al. | |
| 6,259,321 B1 | 7/2001 | Song et al. | |
| 6,304,142 B1 | 10/2001 | Madni | |
| 6,429,690 B1 | 8/2002 | Castellucci et al. | |
| 6,594,504 B1 * | 7/2003 | Grasset | 455/550.1 |
| 6,744,308 B1 * | 6/2004 | Beumer | 327/563 |
| 6,794,941 B2 * | 9/2004 | Wichern et al. | 330/254 |

FOREIGN PATENT DOCUMENTS

| | | |
|---|---|---|
| EP | 0148706 | 7/1985 |
| JP | 58-204614 | 11/1983 |
| JP | 4-345305 | 12/1992 |
| JP | 5-31349 | 4/1993 |

(Continued)

Primary Examiner—Henry Choe
(74) Attorney, Agent, or Firm—McDermott Will & Emery LLP

(57) ABSTRACT

An FET is connected between the emitters of first and second transistors. The emitter of the first transistor is connected to a ground terminal through a plurality of resistors and the emitter of the second transistor is connected to the ground terminal through a plurality of resistors. Another FET is connected between a node between the plurality of resistors on one side and a node between the plurality of resistors on the other side. The gates of the FETs are connected to a control terminal receiving a control voltage through resistors respectively. The resistors and the FETs form a variable resistance circuit. Alternatively, two FETs are serially connected between nodes connected to the emitters of the first and second transistors. Another FET is connected between a node between the two FETs and a ground terminal. The gates of the two FETs are connected to a control terminal receiving a control voltage through resistors respectively. The gate of the other FET is connected to a control terminal receiving a control voltage through a resistor. The control voltages change complementarily to each other. The FETs form a variable resistance circuit.

4 Claims, 20 Drawing Sheets

FOREIGN PATENT DOCUMENTS

| | | |
|---|---|---|
| JP | 60-160717 | 8/1995 |
| JP | 08-139531 | 5/1996 |
| JP | 8-256039 | 10/1996 |
| JP | 8-288791 | 11/1996 |
| JP | 9-46176 A | 2/1997 |
| JP | 11-168334 | 6/1999 |
| JP | 11-509711 | 8/1999 |
| JP | 2000-277703 A | 10/2000 |

* cited by examiner

F I G. 1
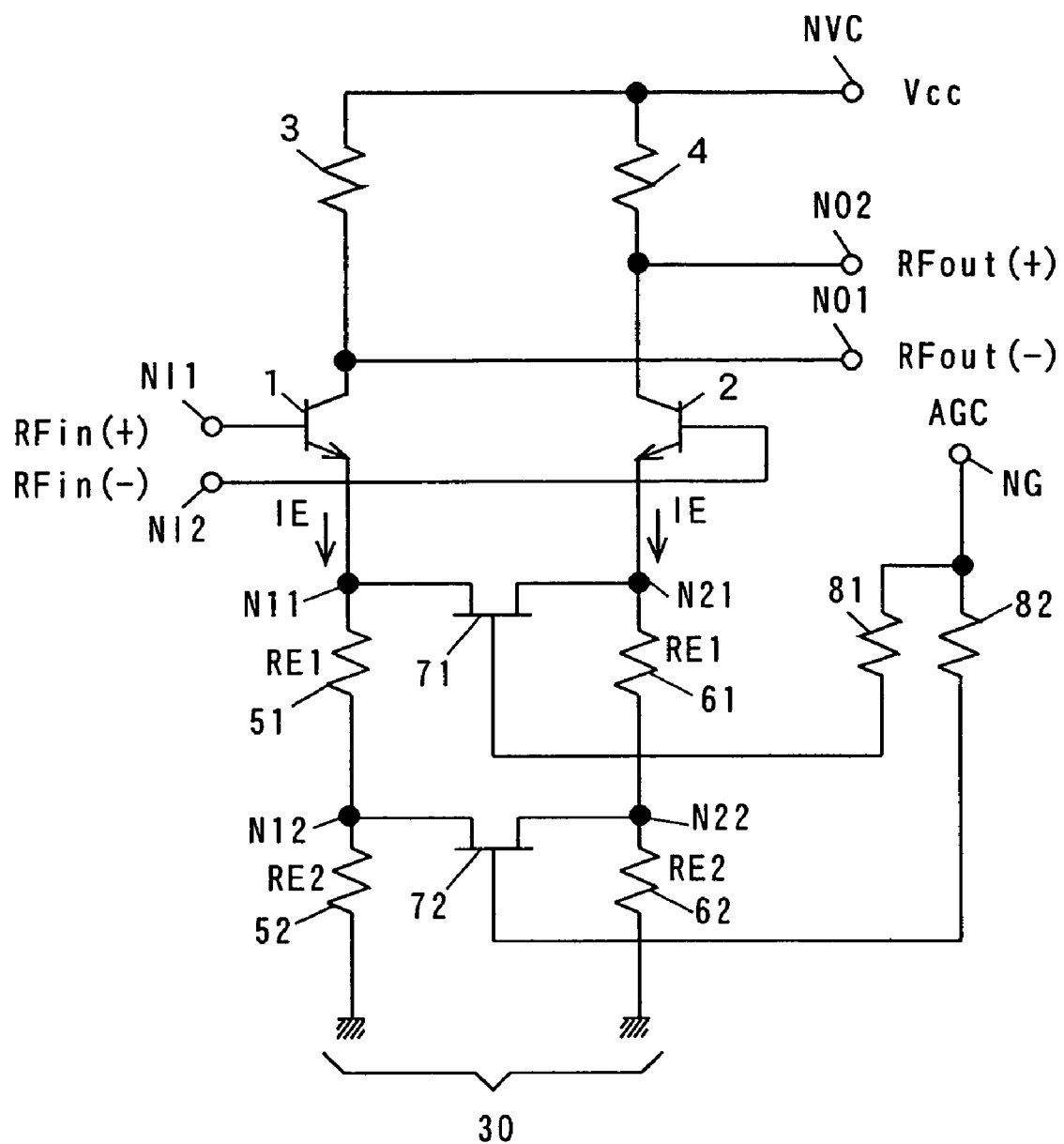

F I G. 8
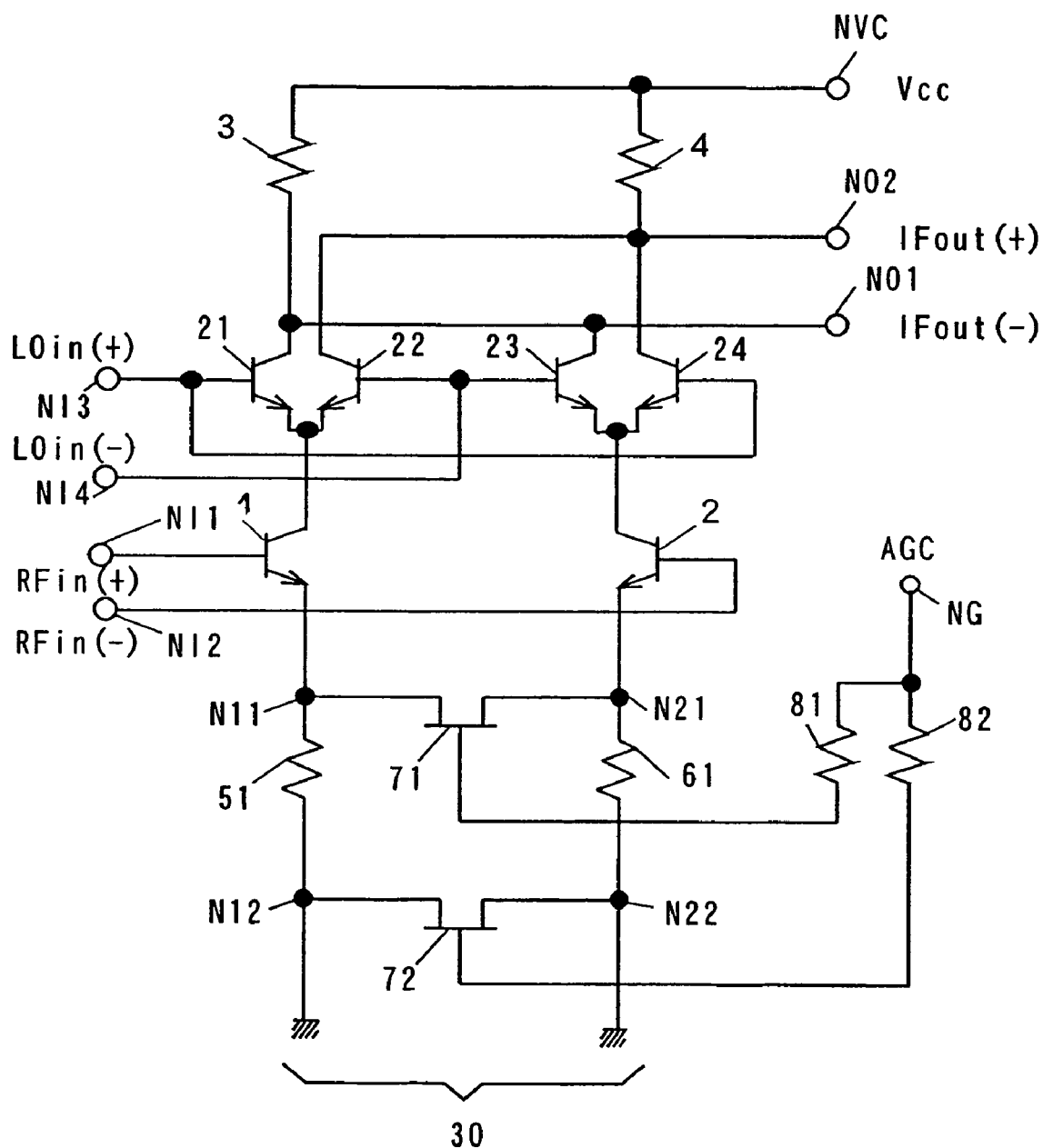

VARIABLE GAIN DIFFERENTIAL AMPLIFIER AND MULTIPLICATION CIRCUIT

RELATED APPLICATION

This application is a divisional of application Ser. No. 10/810,833 filed on Mar. 29, 2004, which is a divisional of application Ser. No. 10/305,359 filed on Nov. 27, 2002.

BACKGROUND OF THE INVENTION

1. Field of the Invention

The present invention relates to a variable gain differential amplifier and a multiplication circuit.

2. Description of the Background Art

A variable gain differential amplifier (differential amplification circuit having a variable gain function) is employed in general. An integrated circuit employing Si (silicon) devices such as bipolar transistors and MOSFETs (metal oxide semiconductor field-effect transistors) mainly includes an amplifier having a Gilbert-cell structure or an OTA (operational transconductance amplifier) structure as the variable gain differential amplifier.

The amplifier having a Gilbert-cell structure has a wide variable gain range, but is inferior in power consumption and noise property. Therefore, a mobile communication device or the like generally employs an OTA structure having a variable resistance circuit formed by an FET switch and the like in a differential amplifier.

FIG. 20 is a circuit diagram of a conventional variable gain differential amplifier having an OTA structure.

The variable gain differential amplifier shown in FIG. 20 is formed by bipolar transistors (hereinafter simply referred to as transistors) 101 and 102, resistors 103, 104, 105 and 106 and an n-MOSFET (hereinafter simply referred to as an FET) 107. The FET 107 forms a variable resistance circuit 200.

The base of the transistor 101 is connected to an input terminal NI1 receiving an input signal RFin(+), and the base of the transistor 102 is connected to another input terminal NI2 receiving another input signal RFin(−). The input signals RFin(+) and RFin(−) are differential inputs. The collectors of the transistors 101 and 102 are connected to a power supply terminal NVC receiving a power supply voltage Vcc through the resistors 103 and 104 respectively. The emitters of the transistors 101 ad 102 are connected to ground terminals through the resistors 105 and 106 respectively. The collectors of the transistors 101 and 102 are connected to output terminals NO1 and NO2 respectively. Output signals RFout(+) and RFout(−) are derived from the output terminals NO1 and NO2 respectively. The output signals RFout(+) and RFout(−) are differential outputs.

The FET 107 is connected between nodes N1 and N2 connected to the emitters of the transistors 101 and 102 respectively. The gate of the FET 107 is connected to a control terminal NG receiving a control voltage AGC through a resistor 110.

In the variable gain differential amplifier shown in FIG. 20, the control voltage AGC is applied to the gate of the FET 107 for changing source-to-drain resistance of the FET 107, thereby performing gain control. When the FET 107 is brought into an ON-state, for example, the maximum gain and a low noise characteristic are attained. In this case, the variable gain differential amplifier is suitable for amplifying a small high-frequency signal. When the FET 107 is brought into an OFF-state, on the other hand, attenuation is maximized (minimum gain) to improve the distortion characteristic. In this case, the variable gain differential amplifier is resistant against cross modulation in a state having high electric field strength.

In the aforementioned variable gain differential amplifier, continuous gain control can be performed by varying the control voltage AGC supplied to the gate of the FET 107 forming the variable resistance circuit 200.

However, the variable resistance circuit 200 of the aforementioned variable gain differential amplifier has strong nonlinearity in a region of the control voltage AGC around a pinch-off voltage of the FET 107. Thus, the distortion characteristic is deteriorated in the vicinity of a specific control voltage level. When the FET 107 is supplied with the control voltage AGC at which waveform distortion is increased in continuous gain control, therefore, the distortion characteristic of the variable gain differential amplifier is deteriorated.

In the variable gain differential amplifier shown in FIG. 20, a high-frequency amplifier superior in dynamic range is implemented as the ratio of the impedance of the FET 107 in an OFF-state to the impedance in an ON-state is increased. It is ideal that the ON-state impedance (Zon) of the FET 107 reaches zero and the OFF-state impedance (Zoff) thereof is infinite.

However, the ideal state cannot be implemented due to finite ON-state resistance present in the ON-state of the FET 107 and finite OFF-state capacitance present in the OFF-state thereof.

FIG. 21(a) is a circuit diagram of the variable resistance circuit 200 of the variable gain differential amplifier shown in FIG. 20, FIG. 21(b) is an equivalent circuit diagram of the variable resistance circuit 200 with the FET 107 in an ON-state, and FIG. 21(c) is an equivalent circuit diagram of the variable resistance circuit 200 with the FET 107 in an OFF-state.

It is assumed that Ron represents the ON-state resistance of the FET 107 and Coff represents the OFF-state capacitance thereof.

The finite ON-state resistance Ron is present between the nodes N1 and N2 in the ON-state of the FET 107, while the finite OFF-state capacitance Coff is present between the nodes N1 and N2 in the OFF-state thereof. Thus, no ideal state can be implemented.

In general, the ON-state resistance Ron and the OFF-state capacitance Coff of the FET 107 are expressed as follows with the gate width Wg thereof:

$$Ron = Ron(mm)/Wg(mm) \quad (1)$$

$$Coff = Coff(mm) \times Wg(mm) \quad (2)$$

where Ron(mm) represents the ON-state resistance per 1 mm of the gate width Wg, and Coff(mm) represents the OFF-state capacitance per 1 mm of the gate width Wg. It is understood from the above equations (1) and (2) that the ON-state resistance Ron is reduced and the OFF-state capacitance Coff is increased when the gate width Wg is increased. It is also understood that the ON-state resistance Ron is increased and the OFF-state capacitance Coff is reduced when the gate width Wg is reduced.

If the gate width Wg of the FET 107 is increased to reduce the ON-state resistance Ron thereby improving a noise factor with respect to a small signal in the aforementioned conventional variable gain differential amplifier, the OFF-state capacitance Coff is increased in proportion to the gate width Wg to reduce the OFF-state impedance in a high-frequency domain when receiving a large signal. In other words, the distortion characteristic is deteriorated in this case. If distortion is preferentially reduced, the noise factor is disadvantageously deteriorated with respect to a small signal.

SUMMARY OF THE INVENTION

An object of the present invention is to provide a variable gain differential amplifier and a multiplication circuit capable of reducing distortion to under a certain level.

Another object of the present invention is to provide a variable gain differential amplifier and a multiplication circuit capable of increasing the gain and reducing noise when receiving a small signal while reducing distortion when receiving a large signal.

"Multiplication circuit" is also called as "multiplier" and the term "multiplication circuit" covers "mixer".

A variable gain differential amplifier according to an aspect of the present invention comprises a variable impedance circuit, a first transistor having a first terminal receiving a first input signal, a second terminal connected to a first potential through a first load and a third terminal connected to the variable impedance circuit and a second transistor having a first terminal receiving a second input signal, a second terminal connected to the first potential through a second load and a third terminal connected to the variable impedance circuit, and the variable impedance circuit includes one or more first resistive elements connected between the third terminal of the first transistor and a second potential, one or more second-resistive elements connected between the third terminal of the second transistor and the second potential and a plurality of variable impedance devices connected between one end of at least one first resistive element and one end of at least one second resistive element and between the other end of at least one first resistive element and the other end of at least one second resistive element respectively and having control terminals for receiving a common control voltage.

In the variable gain differential amplifier according to this aspect of the present invention, the first and second transistors differentially amplify the first and second input signals.

When a current flows from the first potential to the second potential through the first load, the first transistor and at least one first resistive element, the first resistive element develops a voltage drop. When a current flows from the first potential to the second potential through the second load, the second transistor and at least one second resistive element, the second resistive element develops a voltage drop. Thus, the potentials on one ends of the plurality of variable impedance devices differ from each other, and the potentials on the other ends of the plurality of variable impedance devices also differ from each other. In this case, the control terminals of the plurality of variable impedance devices are supplied with the common control voltage, so that the voltages of the control terminals relative to the one and the other ends of the plurality of variable impedance devices differ from each other. This is equal to a state of applying different control voltages to the plurality of variable impedance devices. When continuous gain control is performed by varying the control voltage, the distortion characteristic is consequently inhibited from abrupt deterioration at a specific control voltage level. Therefore, distortion lower than a certain level can be achieved.

The plurality of variable impedance devices may be a plurality of field-effect transistors having gates receiving the common control voltage.

In this case, the potentials on the sources of the plurality of field-effect transistors differ from each other, and the potentials on the drains of the plurality of field-effect transistors also differ from each other. The gates of the plurality of field-effect transistors are supplied with the common control voltage, so that the voltages of the gates relative to the sources and the drains of the plurality of field-effect transistors differ from each other. This is equal to a state of applying different control voltages to the plurality of field-effect transistors. When continuous gain control is performed by varying the control voltage, the distortion characteristic is consequently inhibited from abrupt deterioration at a specific control voltage level.

The one or more first resistive elements may include a first resistor connected between the third terminal of the first transistor and a first node and a second resistor connected between the first node and a second node receiving the second potential, the one or more second resistive elements may include a third resistor connected between the third terminal of the second transistor and a third node and a fourth resistor connected between the third node and a fourth node receiving the second potential, and the plurality of variable impedance devices may include a first variable impedance device connected between the third terminal of the first transistor and the third terminal of the second transistor and a second variable impedance device connected between the first node and the third node.

In this case, the potential on one end of the first variable impedance device and the potential on one end of the second variable impedance device differ from each other due to a voltage drop on the first resistor while the potential on the other end of the first variable impedance device and the potential on the other end of the second variable impedance device differ from each other due to a voltage drop on the third resistor. Therefore, different control voltages are applied to the first and second variable impedance devices. Consequently, distortion lower than a certain level can be achieved.

The one or more first resistive elements may include a first resistor connected between the third terminal of the first transistor and a first node receiving the second potential, the one or more second resistive elements may include a second resistor connected between the third terminal of the second transistor and a second node receiving the second potential, and the plurality of variable impedance devices may include a first variable impedance device connected between the third terminal of the first transistor and the third terminal of the second transistor and a second variable impedance device connected between the first node and the second node.

In this case, the potential on one end of the first variable impedance device and the potential on one end of the second variable impedance device differ from each other due to a voltage drop on the first resistor while the voltage on the other end of the first variable impedance device and the potential on the other end of the second variable impedance device differ from each other due to a voltage drop on the second resistor. Therefore, different control voltages are applied to the first and second variable impedance devices. Consequently, distortion lower than a certain level can be achieved.

The one or more first resistive elements may include a first resistor connected between the third terminal of the first transistor and a first node, a second resistor connected between the first node and a second node and a third resistor connected between the second node and a third node receiving the second potential, the one or more second resistive elements may include a fourth resistor connected between the third terminal of the second transistor and a fourth node, a fifth resistor connected between the fourth node and a fifth node and a sixth resistor connected between the fifth node and a sixth node receiving the second potential, and the plurality of variable impedance devices may include a first variable impedance device connected between the first node and said fourth node and a second variable impedance device connected between the second node and the fifth node.

In this case, the potential on one end of the first variable impedance device and the potential on one end of the second variable impedance device differ from each other due to a voltage drop on the second resistor while the potential on the other end of the first variable impedance device and the potential on the other end of the second variable impedance device differ from each other due to a voltage drop on the fifth resistor. Therefore, different control voltages are applied to the first and second variable impedance devices. Consequently, distortion lower than a certain level can be achieved.

The one or more first resistive elements may include a first resistor connected between the third terminal of the first transistor and a first node and a second resistor connected between the first node and a second node receiving the second potential, the one or more second resistive elements may include a third resistor connected between the third terminal of the second transistor and a third node and a fourth resistor connected between the third node and a fourth node receiving the second potential, and the plurality of variable impedance devices may include a first variable impedance device connected between the first node and the third node and a second variable impedance device connected between the second node and the fourth node.

In this case, the potential on one end of the first variable impedance device and the potential on one end of the variable impedance device differ from each other due to a voltage drop on the second resistor while the potential on the other end of the first variable impedance device and the potential on the other end of the second variable impedance device differ from each other due to a voltage drop on the fourth resistor. Therefore, different control voltages are applied to the first and second variable impedance devices. Consequently, distortion lower than a certail level can be achieved.

Each of the first and second transistors may be a bipolar transistor or a field-effect transistor.

The variable gain differential amplifier may further comprise a first output terminal connected to the second terminal of the first transistor for deriving a first output signal and a second output terminal connected to the second terminal of the second transistor for deriving a second output signal.

In this case, the first and second output signal indicating the result of differential amplification of the first and second input signals are derived on the first and second output terminals as differential outputs.

A multiplication circuit according to another aspect of the present invention comprises first, second, third, fourth, fifth and sixth transistors each having a first terminal, a second terminal and a third terminal and a variable impedance circuit, while the first terminal of the first transistor receives a first input signal, the second terminal of the first transistor is connected to a first potential through a first load and the third terminal of the first transistor is connected to the second terminal of the fifth transistor, the first terminal of the second transistor receives a second input signal, the second terminal of the second transistor is connected to the first potential through a second load and the third terminal of the second transistor is connected to the second terminal of the fifth transistor, the first terminal of the third transistor receives the second input signal, the second terminal of the third transistor is connected to the first potential through the first load and the third terminal of the third transistor is connected to the second terminal of the sixth transistor, the first terminal of the fourth transistor receives the first input signal, the second terminal of the fourth resistor is connected to the second potential through the second load and the third terminal of the fourth transistor is connected to the second terminal of the sixth transistor, the first terminal of the fifth transistor receives a third input signal, the first terminal of the sixth transistor receives a fourth input signal, and the variable impedance circuit includes one or more first resistive elements connected to the third terminal of the fifth transistor and the second potential, one or more second resistive elements connected to the third terminal of the sixth transistor and the second potential and a plurality of variable impedance devices connected between one end of at least one first resistive element and one end of at least one second resistive element and between the other end of at least one first resistive element and the other end of at least one second resistive element respectively and having control terminals receiving a common control voltage.

In the multiplication circuit according to this aspect of the present invention, the first to fourth transistors differentially amplify the first and second input signals and the fifth and sixth transistors differentially amplify the third and fourth input signals, while the result of differential amplification of the first and second input signals and the result of differential amplification of the third and fourth input signals are multiplied by each other.

When a current flows from the first potential to the fifth transistor through the first and second loads and the first and second transistors and the current further flows to the second potential through the fifth transistor and at least one first resistive element, the first resistive element develops a voltage drop. When a current flows from the first potential to the sixth transistor through the first and second loads and the third and fourth transistors and the current further flows to the second potential through the sixth transistor and at least one first resistive element, the second resistive element develops a voltage drop. Thus, the potentials on one ends of the plurality of variable impedance devices differ from each other while the potentials on the other ends of the plurality of variable impedance devices also differ from each other. In this case, the control terminals of the plurality of variable impedance devices are supplied with the common control voltage, so that the voltages of the control terminals relative to one and the other ends of the plurality of variable impedance devices differ from each other. This is equal to a state of applying different control voltages to the plurality of variable impedance devices. When continuous gain control is performed by varying the control voltage, the distortion characteristic is consequently inhibited from abrupt deterioration at a specific control voltage level. Therefore, distortion lower than a certain level can be achieved.

The plurality of variable impedance devices may be a plurality of field-effect transistors having gates receiving the common control voltage.

In this case, the potentials on the sources of the plurality of field-effect transistors differ from each other, and the potentials on the drains of the plurality of field-effect transistors also differ from each other. The gates of the plurality of field-effect transistors are provided with the common control voltage, so that the voltages of the gates relative to the sources and the drains of the plurality of field-effect transistor differ from each other. This is equal to a state of applying different control voltages to the plurality of field-effect transistors. When continuous gain control is performed by varying the control voltage, the distortion characteristic is consequently inhibited from abrupt deterioration at a specific control voltage level.

The one or more first resistive elements may include a first resistor connected between the third terminal of the fifth transistor and a first node and a second resistor connected between the first node and a second node receiving the second potential, the one or more second resistive elements may include a third resistor connected between the third terminal of the sixth transistor and a third node and a fourth resistor connected between the third node and a fourth node receiving the second potential, and the plurality of variable impedance devices may include a first variable impedance device connected between the third terminal of the fifth transistor and the third terminal of the sixth transistor and a second variable impedance device connected between the first node and the third node.

In this case, the potential on one end of the first variable impedance device and the potential on one end of the second variable impedance device differ from each other due to a voltage drop on the first resistor while the potential on the other end of the first variable impedance device and the potential on the other end of the second variable impedance device differ from each other due to a voltage drop on the third resistor. Therefore, different control voltages are applied to the first and second variable impedance devices. Consequently, distortion lower than a certain level can be achieved.

The one or more first resistive elements may include a first resistor connected between the third terminal of the fifth transistor and a first node receiving the second potential, the one or more second resistive elements may include a second resistor connected between the third terminal of the sixth transistor and a second node receiving the second potential, and the plurality of variable impedance devices may include a first variable impedance device connected between the third terminal of the fifth transistor and the third terminal of the sixth transistor and a second variable impedance device connected between the first node and the second node.

In this case, the potential on one end of the first variable impedance device and the potential on one end of the second variable impedance device differ from each other due to a voltage drop on the first resistor while the potential on the other end of the first variable impedance device and the potential on the other end of the second variable impedance device differ from each other due to a voltage drop on the second resistor. Therefore, different control voltages are applied to the first and second variable impedance devices. Consequently, distortion lower than a certain level can be achieved.

The one or more first resistive elements may include a first resistor connected between the third terminal of the fifth transistor and a first node, a second resistor connected between the first node and a second node and a third resistor connected between the second node and a third node receiving the second potential, the one or more second resistive elements may include a fourth resistor connected between the third terminal of the sixth transistor and a fourth node, a fifth resistor connected between the fourth node and a fifth node and a sixth resistor connected between the fifth node and a sixth node receiving the second potential, and the plurality of variable impedance devices may include a first variable impedance device connected between the first node and the fourth node and a second variable impedance device connected between the second node and the fifth node.

In this case, the potential on one end of the first variable impedance device and the potential on one end of the second variable impedance device differ from each other due to a voltage drop on the second resistor while the potential on the other end of the first variable impedance device and the potential on the other end of the second variable impedance device differ from each other due to a voltage drop on the fifth resistor. Therefore, different control voltages are applied to the first and second variable impedance devices. Consequently, distortion lower than a certain level can be achieved.

The one or more first resistive elements may include a first resistor connected between the third terminal of the fifth transistor and a first node and a second resistor connected between the first node and a second node receiving the second potential, the one or more second-resistive elements may include a third resistor connected between the third terminal of the sixth transistor and a third node and a fourth resistor connected between the third node and a fourth node receiving the second potential, and the plurality of variable impedance devices may include a first variable impedance device connected between the first node and the third node and a second variable impedance device connected between the second node and the fourth node.

In this case, the potential on one end of the first variable impedance device and the potential on one end of the second variable impedance device differ from each other due to a voltage drop on the second resistor while the potential on the other end of the first variable impedance device and the potential on the other end of the second variable impedance device differ from each other due to a voltage drop on the fourth resistor. Therefore, different control voltages are applied to the first and second variable impedance devices. Consequently, distortion lower than a certain level can be achieved.

Each of the first to sixth transistors may be a bipolar transistor or a field-effect transistor.

The multiplication circuit may further comprise a first output terminal connected to the second terminals of the first and third transistors for deriving a first output signal and a second output terminal connected to the second terminals of the second and fourth transistors for deriving a second output signal.

In this case, the first and second output signals indicating the result of multiplication of the result of differential amplification of the first and second input signals and the result of differential amplification of the third and fourth input signals are derived on the first and second output terminal as differential outputs.

A variable gain differential amplifier according to still another aspect of the present invention comprises a first transistor having a first terminal receiving a first input signal, a second terminal connected to a first potential through a first load and a third terminal connected to a second potential through a second load, a second transistor having a first terminal receiving a second input signal, a second terminal connected to the first potential through a third load and a third terminal connected to the second potential through a fourth load and a variable impedance circuit connected between the third terminal of the first transistor and the third terminal of the second transistor, while the variable impedance circuit includes a plurality of first variable impedance devices serially connected between the third terminal of the first transistor and the third terminal of the second transistor and at least one second variable impedance device that is connected between a node between the plurality of first variable impedance devices and the second potential and is turned on/off complementarily to the plurality of first variable impedance devices.

In the variable gain differential amplifier according to this aspect of the present invention, the first and second transistors differentially amplify the first and second input signals. In this case, the plurality of first variable impedance devices and at least one second variable impedance device of the variable impedance circuit are turned on/off complementarily to each other, so that the impedance of the variable impedance circuit is varied.

When a small signal is input, the plurality of first variable impedance devices are turned on and at least one second variable impedance device is turned off. Thus, the impedance of the variable impedance circuit is reduced. When a large signal is input, the plurality of first variable impedance devices are turned off and at least one second variable impedance device is turned on. Thus, the impedance of the variable impedance circuit is increased.

In this case, the ratio of the impedance of the variable impedance circuit obtained when the first variable impedance devices are off and the second variable impedance device is on to the impedance of the variable impedance circuit obtained when the first variable impedance devices are on and the second variable impedance device is off is increased. Consequently, increase of the gain and reduction of noises can be achieved when receiving a small signal while reduction of distortion can be achieved when receiving a large signal, also in a high-frequency domain.

The variable gain differential amplifier may further comprise an output terminal connected to the second terminal of the second transistor for deriving an output signal.

In this case, an output signal indicating the result of differential amplification of the first and second input signals is derived on the output terminal.

The variable gain differential amplifier may further comprise a first output terminal connected to the second terminal of the first transistor for deriving a first output signal and a second output terminal connected to the second terminal of the second transistor for deriving a second output signal.

In this case, first and second output signals indicating the result of differential amplification of the first and second input signals are derived on the first and second output terminals as differential outputs.

The variable gain differential amplifier may further comprise an input terminal receiving the first input signal for supplying the first input signal to the first terminal of the first transistor and an inversion circuit that inverts the first input signal from the input terminal for supplying the inverted first input signal to the first terminal of the second transistor as a second signal.

When a single first input signal is supplied, the first input signal is invented and the first input signal and the inverted signal thereof are differentially amplified.

A multiplication circuit according to a further aspect of the present invention comprises first, second, third, fourth, fifth and sixth transistors each having a first terminal, a second terminal and a third terminal and a variable impedance circuit, while the first terminal of the first transistor receives a first input signal, the second terminal of the first transistor is connected to a first potential through a first load and the third terminal of the first transistor is connected to the second terminal of the fifth transistor, the first terminal of the second transistor receives a second input signal, the second terminal of the second transistor is connected to the first potential through a second load and the third terminal of the second transistor is connected to the second terminal of the fifth transistor, the first terminal of the third transistor receives the second input signal, the second terminal of the third transistor is connected to the first potential through the first load and the third terminal of the third transistor is connected to the second terminal of the sixth transistor, the first terminal of the fourth transistor receives the first input signal, the second terminal of the fourth transistor is connected to the first potential through the second load and the third terminal of the fourth transistor is connected to the second terminal of the sixth transistor, the first terminal of the fifth transistor receives a third input signal and the third terminal of the fifth transistor is connected to a second potential through a third load, the first terminal of the sixth transistor receives a fourth input signal and the third terminal of the sixth transistor is connected to the second potential through a fourth load, and the variable impedance circuit includes a plurality of first variable impedance devices serially connected between the third terminal of the fifth transistor and the third terminal of the sixth transistor and at least one second variable impedance device that is connected between a node between the plurality of first variable impedance devices and the second potential and is turned on/off complementarily to the plurality of first variable impedance devices.

In the multiplication circuit according to this aspect of the present invention, the first to fourth transistors differentially amplify the first and second input signals, the fifth and sixth transistors differentially amplify the third and fourth input signals, and the result of differential amplification of the first and second input signals and the result of differential amplification of the third and fourth input signals are multiplied by each other.

In this case, the plurality of first variable impedance devices and at least one second variable impedance device of the variable impedance circuit are turned on/off complementarily to each other, so that the impedance of the variable impedance circuit is varied.

When a small signal is received, the plurality of first variable impedance devices are turned on and at least one second variable impedance device is turned off. Thus, the impedance of the variable impedance circuit is reduced. When a large signal is input, the plurality of first variable impedance devices are turned off and at least one second variable impedance device is turned on. Thus, the impedance of the variable impedance circuit is increased.

In this case, the ratio of the impedance of the variable impedance circuit obtained when the first variable impedance devices are off and the second variable impedance device is on to the impedance of the variable impedance circuit obtained when the first variable impedance devices are on and the second variable impedance device is off is increased. Consequently, increase of the gain and reduction of noise can be achieved when receiving a small signal while reduction of distortion can be achieved when receiving a large signal, also in a high-frequency domain.

The multiplication circuit may further comprise an output terminal connected the second terminals of the second and fourth transistors for deriving an output signal.

In this case, an output signal indicating the result of multiplication of the result of differential amplification of the first and second input signals and the result of differential amplification of the third and fourth input signals is derived on the output terminal.

The multiplication circuit may further comprise a first output terminal connected to the second terminals of the first and third transistors for deriving a first output signal and a second output terminal connected to the second terminals of said second and fourth transistors for deriving a second output signal.

In this case, the first and second output signals indicating the result of multiplication of the result of differential amplification of the first and second input signals and the result of differential amplification of the third and fourth input signals are derived on the first and second output terminals as differential outputs.

The multiplication circuit may further comprise a first input terminal receiving the first input signal for supplying the first input signal to the first terminals of the first and fourth transistors, a first inversion circuit that inverts the first input signal from the first input terminal for supplying the inverted first input signal to the first terminals of the second and third transistors as the second input signal, a second input terminal receiving the third input signal for supplying the third input signal to the first terminal of the fifth transistor and a second inversion circuit that inverts the third input signal from the second input terminal for supplying the inverted third input signal to the first terminal of the sixth transistor as the fourth input signal.

When a single first input signal and a single third input signal are supplied, the first and third input signals are inverted respectively and the first input signal and the inverted signal thereof are differentially amplified while the third input signal and the inverted signal thereof are differentially amplified and the result of differential amplification of the first input signal and the inverted signal thereof and the result of differential amplification of the third input signal and the inverted signal thereof are multiplied by each other.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram showing the structure of a variable gain differential amplifier according to a first embodiment of the present invention;

FIG. 8 is a circuit diagram showing the structure of a Gilbert-cell multiplication circuit according to a seventh embodiment of the present invention;

DESCRIPTION OF THE PREFERRED EMBODIMENTS

Figure 2:
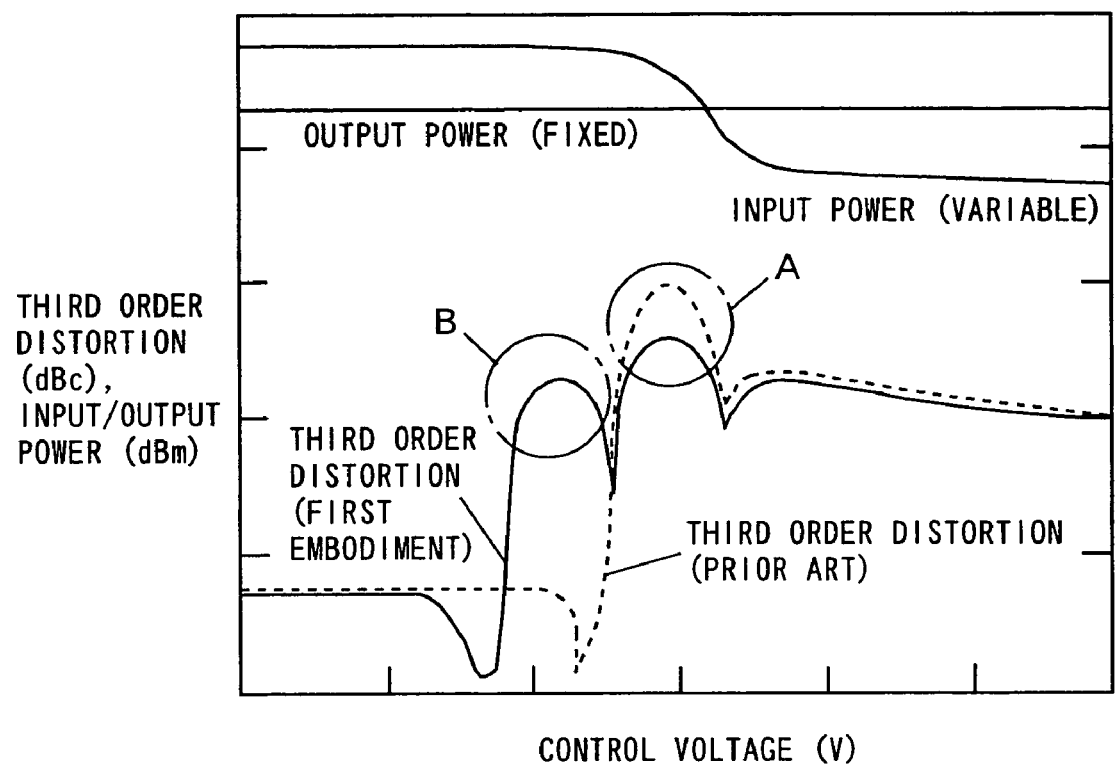
FIG. 2 illustrates the results of calculation of control voltage dependency of distortion characteristics in the variable gain differential amplifier according to the first embodiment shown in FIG. 1 and a variable gain differential amplifier shown in FIG. 20.

FIG. 1 is a circuit diagram showing the structure of a variable gain differential amplifier according to a first embodiment of the present invention.

The variable gain differential amplifier shown in FIG. 1 is formed by bipolar transistors (hereinafter simply referred to as transistors) 1 and 2, resistors 3, 4, 51, 52, 61, 62, 81 and 92 and n-MOSFETs (hereinafter simply referred to FETs) 71 and 72. The resistors 3, 4, 51, 52, 61 and 62 serve as constant current sources.

The base of the transistor 1 is connected to an input terminal NI1 receiving an input signal RFin(+), and the base of the transistor 2 is connected to another input terminal NI2 receiving another input signal RFin(−). The input signals RFin(+) and RFin(−) are differential inputs. The collectors of the transistors 1 and 2 are connected to a power supply terminal NVC receiving a power supply voltage Vcc through the resistors 3 and 4 respectively.

The collectors of the transistors 1 and 2 are connected to output terminals N01 an N02 respectively. Output signals RFout(+) and RFout(−) are derived from the output terminals N01 and N02 respectively. The output signals RFout(+) and RFout(−) are differential outputs.

The emitter of the transistor 1 is connected to a node N11, the resistor 51 is connected between the node N11 and another node N12, and the resistor 52 is connected between the node N12 and a ground terminal. The emitter of the transistor 2 is connected to a node N21, the resistor 61 is connected between the node N21 and another node N22, and the resistor 62 is connected between the node N22 and a ground terminal.

The FET 71 is connected between the nodes N11 and N21, and the FET 72 is connected between the nodes N12 and N22. The gates of the FETs 71 and 72 are connected to a control terminal NG receiving a control voltage AGC through the resistors 81 and 82 respectively. The resistors 51, 52, 61 and 62 and the FETs 71 and 72 form a variable resistance circuit 30.

In this embodiment, the transistor 1 corresponds to the first transistor, the transistor 2 corresponds to the second transistor, and the FETs 71 and 72 correspond to the variable impedance devices. The resistor 3 corresponds to the first load, the resistor 4 corresponds to the second load, the resistors 51 and 52 correspond to the first resistive elements, and the resistors 61 and 62 correspond to the second resistive elements. Further, the variable resistance circuit 30 corresponds to the variable impedance circuit.

The resistors 3 and 4 have equal resistance values, the resistors 51 and 61 have equal resistance values, and the resistors 52 and 62 have equal resistance values respectively. It is assumed that RE1 represents the resistance values of the resistors 51 and 61, and RE2 represents the resistance values of the resistors 52 and 62. It is also assumed that IE represents emitter currents of the transistors 1 and 2.

When the emitter current IE of the transistor 1 flows to the variable resistance circuit 30, the serially connected resistors 51 and 52 develop voltage drops. The voltage drop on the resistor 51 is expressed as RE1×IE, and the voltage drop on the resistor 52 is expressed as RE2×IE. Similarly, a voltage drop on the resistor 61 is expressed as RE1×IE, and a voltage drop on the resistor 62 is expressed as RE2× IE. Thus, the potentials on the sources of the FETs 71 and 72 differ from each other, and the potentials on the drains of the FETs 71 and 72 also differ from each other. In other words, the potential difference between the nodes N11 and N12 is expressed as RE1×IE, and the potential difference between the nodes N21 and N22 is also expressed as RE1×IE.

The gates of the FETs 71 and 72 are supplied with the common control voltage AGC, whereby the gate-to-source voltage and the gate-to-drain voltage of the FET 71 differ from those of the FET 72 respectively. This is equal to a state of supplying different control voltages to the gates of the FETs 71 and 72. When a control voltage at which nonlinearity is maximized is applied to the FET 71, therefore, it follows that a control voltage at which nonlinearity is reduced is applied to the FET 72. When a control voltage at which nonlinearity is maximized is applied to the FET 72, on the other hand, it follows that a control voltage at which nonlinearity is reduced is applied to the FET 71. Consequently, the distortion characteristic of the variable gain differential amplifier at a specific level of the control voltage AGC is inhibited from abrupt deterioration when continuous gain control is performed by varying the control voltage AGC.

Figure 20:
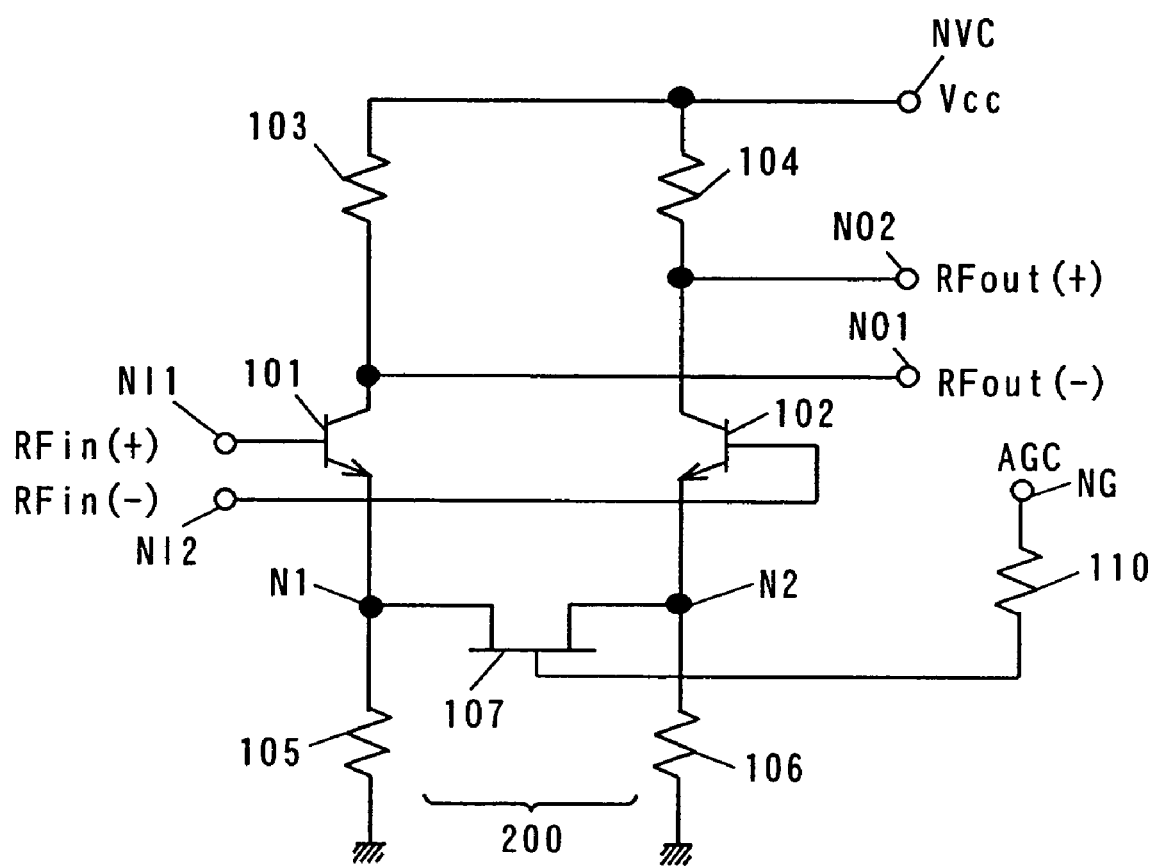
FIG. 20 is a circuit diagram showing the structure of a conventional variable gain differential amplifier.

Distortion characteristics of the variable gain differential amplifier according to the first embodiment shown in FIG. 1 and that shown in FIG. 20 were compared with each other. FIG. 2 illustrates the results of calculation of control voltage dependence of the distortion characteristics in the variable gain differential amplifier according to the first embodiment shown in FIG. 1 and that shown in FIG. 20. Third order distortion was calculated under operating conditions of varying the control voltage AGC with input power while keeping output power constant.

As shown in FIG. 2, third order distortion at a control voltage level A is reduced and third order distortion at a control voltage level B is increased in the variable gain differential amplifier according to the first embodiment shown in FIG. 1 as compared with the conventional variable gain differential amplifier shown in FIG. 20. Thus, the maximum value of third order distortion is reduced and the distortion characteristic is flattened over a wide region of the control voltage.

Thus, in the variable gain differential amplifier according to the first embodiment, distortion lower than a certain level can be achieved.

Figure 3:
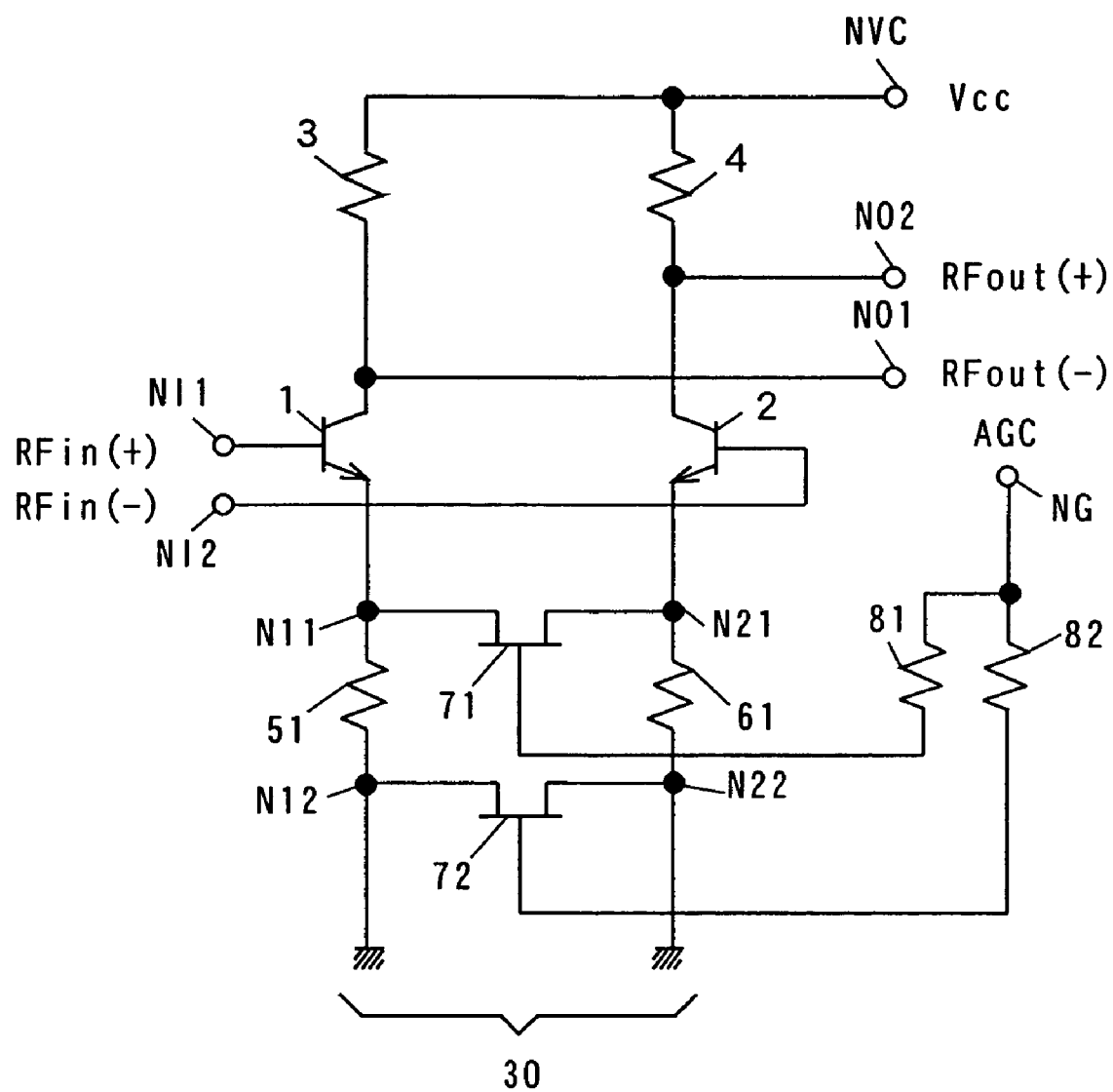
FIG. 3 is a circuit diagram showing the structure of a variable gain differential amplifier according to a second embodiment of the present invention.

FIG. 3 is a circuit diagram showing the structure of a variable gain differential amplifier according to a second embodiment of the present invention.

The variable gain differential amplifier shown in FIG. 3 is different from that shown in FIG. 1 in a point that no resistors 52 and 62 are connected between a node N12 and a ground terminal and between another node N22 and a ground terminal in a variable resistance circuit 30. The structures of the remaining parts of the variable gain differential amplifier shown in FIG. 3 are similar to those of the variable gain differential amplifier shown in FIG. 1.

Also in the variable gain differential amplifier according to this embodiment, the distortion characteristic is improved over a wide region of the variable gain range. In particular, the difference between effective control voltages for two FETs 71 and 72 of the variable resistance circuit 30 can be so increased as to separate peak positions at which the distortion characteristic is deteriorated in the variable gain range.

Figure 4:
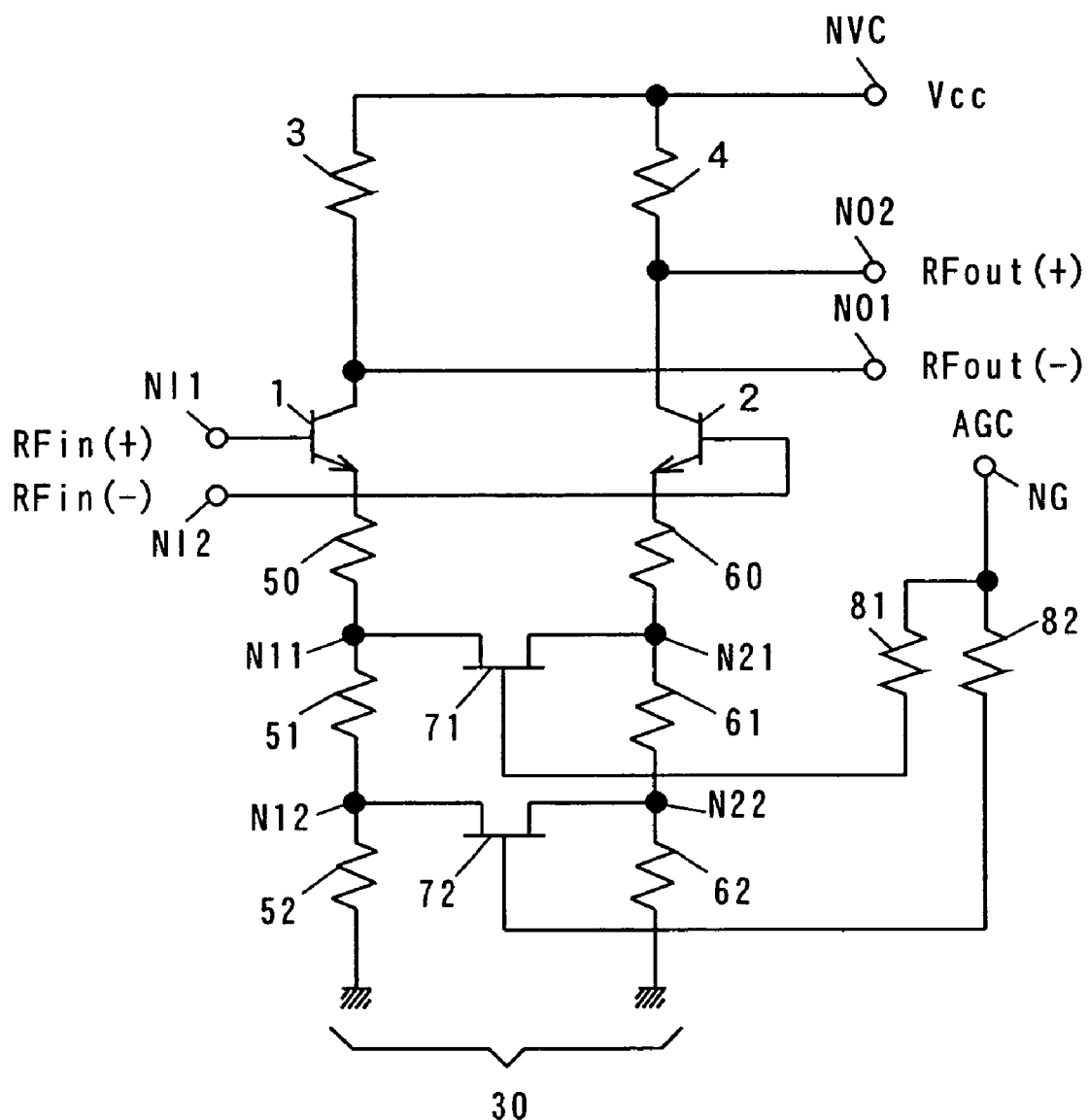
FIG. 4 is a circuit diagram showing the structure of a variable gain differential amplifier according to a third embodiment of the present invention.

FIG. 4 is a circuit diagram showing the structure of a variable gain differential amplifier according to a third embodiment of the present invention.

The variable gain differential amplifier shown in FIG. 4 is different from that shown in FIG. 1 in a point that a resistor 50 is further connected between the emitter of a transistor 1 and a node N11 and another resistor 60 is further connected between the emitter of a transistor 2 and another node N21 in a variable resistance circuit 30. The structures of the remaining parts of the variable gain differential amplifier shown in FIG. 4 are similar to those of the variable gain differential amplifier shown in FIG. 1.

In the variable gain differential amplifier according to this embodiment, distortion lower than a certain level can be achieved although the difference between effective control voltages for two FETs 71 and 72 of the variable resistance circuit 30 cannot be increased as compared with the variable gain differential amplifier according to the second embodiment.

Figure 5:
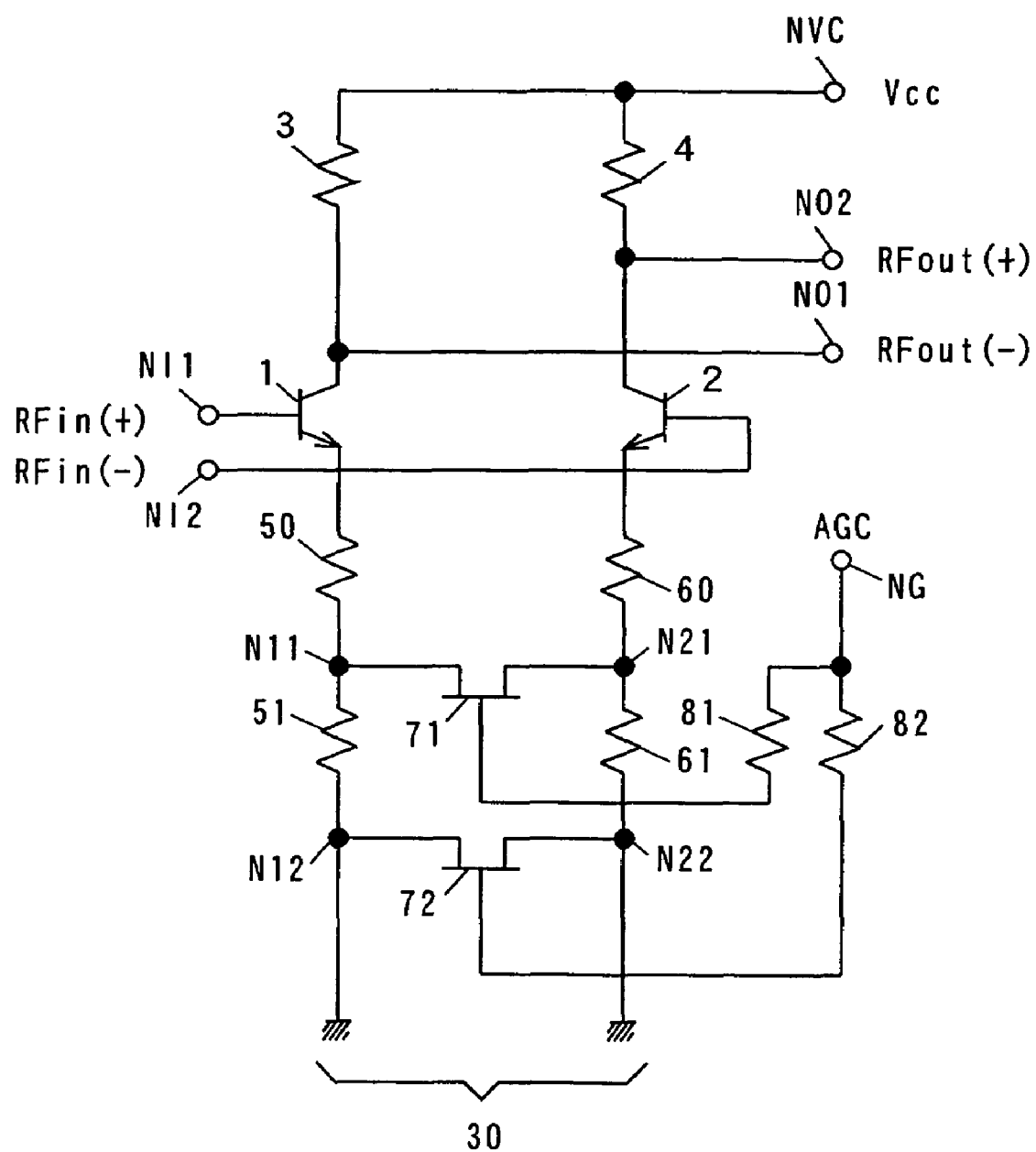
FIG. 5 is a circuit diagram showing the structure of a variable gain differential amplifier according to a fourth embodiment of the present invention.

FIG. 5 is a circuit diagram showing the structure of a variable gain differential amplifier according to a fourth embodiment of the present invention.

The variable gain differential amplifier shown in FIG. 5 is different from that shown in FIG. 1 in a point that a resistor 50 is connected between the emitter of a transistor 1 and a node N11, another resistor 60 is connected between the emitter of a transistor 2 and another node N21 and no resistors 52 and 62 are connected between a node N12 and a ground terminal and between another node N22 and a ground terminal in a variable resistance circuit 30. The structures of the remaining parts of the variable gain differential amplifier shown in FIG. 5 are similar to those of the variable gain differential amplifier shown in FIG. 1.

In the variable gain differential amplifier according to this embodiment, the difference between effective control voltages for two FETs 71 and 72 of the variable resistance circuit 30 can be increased and distortion lower than a certain level can be achieved, although reduction of a noise factor is limited.

Figure 6:
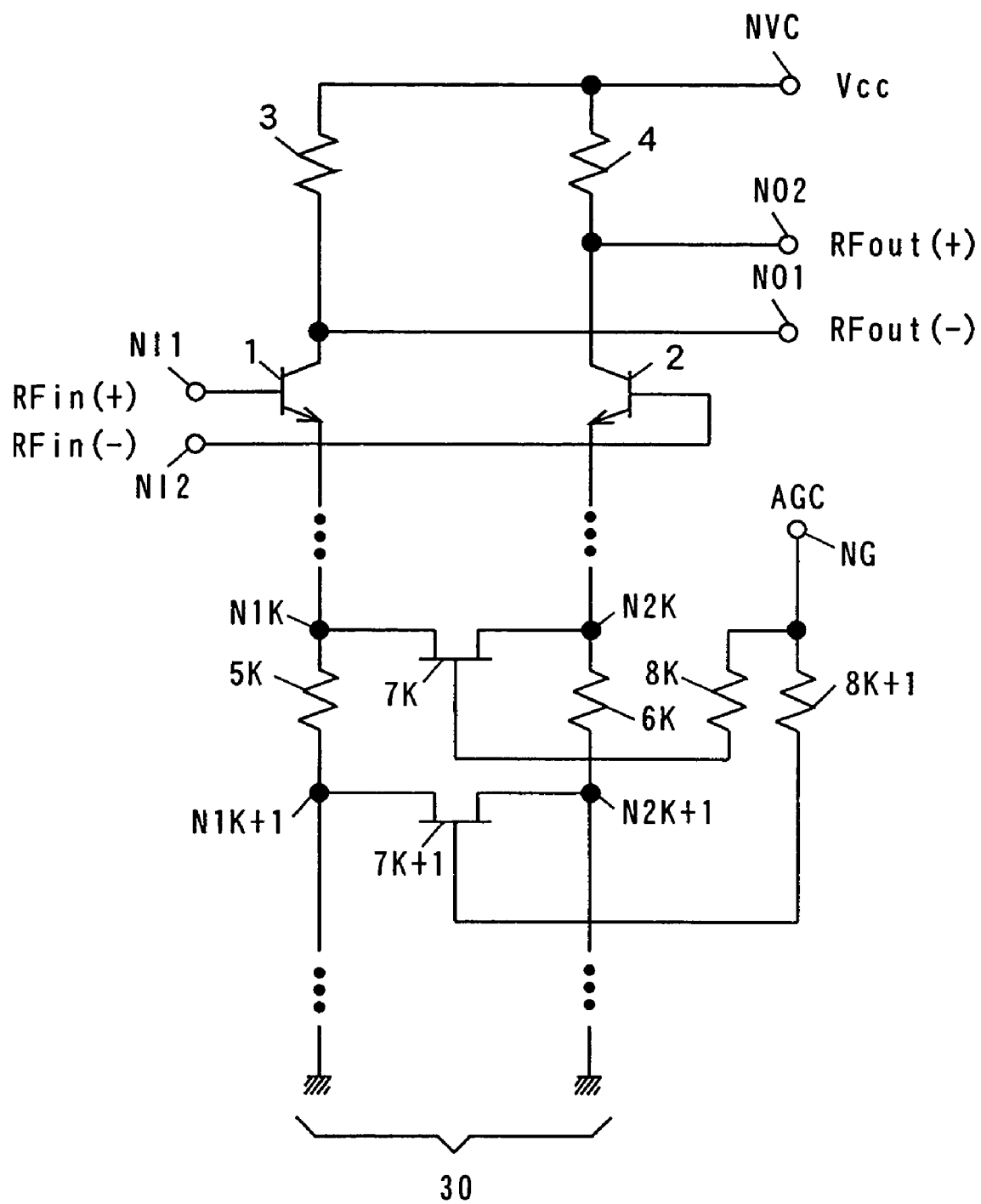
FIG. 6 is a circuit diagram showing the structure of a variable gain differential amplifier according to a fifth embodiment of the present invention.

FIG. 6 is a circuit diagram showing the structure of a variable gain differential amplifier according to a fifth embodiment of the present invention.

The variable gain differential amplifier shown in FIG. 6 is different from that shown in FIG. 1 in a point that (m+1) resistors 50, . . . , 5k, . . . , 5m are serially connected between the emitter of a transistor 1 and a ground terminal, (m+1) resistors 60, . . . , 6k, . . . , 6m are serially connected between the emitter of a resistive transistor 2 and a ground terminal and FETs 71, . . . , 7k, . . . , 7m are connected between nodes N11, . . . , N1k, . . . , N1m between the resistors 50, . . . , 5k, . . . , 5m and nodes N21, . . . , N2k, . . . , N2m between the resistors 60, . . . , 6k, . . . , 6m respectively, where m represents an integer of at least 3. The gates of the FETs 71, . . . , 7k, . . . , 7m are connected to a control terminal NG receiving a control voltage AGC through resistors 81, . . . , 8k, . . . , 8m respectively. FIG. 6 shows only the resistors 5k, 6k, 8k and 8k+1 and the FETs 7k and 7k+1, where k represents 0, . . . , m. The structures of the remaining parts of the variable gain differential amplifier shown in FIG. 6 are similar to those of the variable gain differential amplifier shown in FIG. 1.

Also in the variable gain differential amplifier according to this embodiment, distortion lower than a certain level can be achieved.

In this case, the maximum value of third order distortion at a specific control voltage level is reduced while third order distortion is increased in a wide region of other control voltage levels as the number of the resistors 50, . . . , 5k, . . . , 5m connected between the emitter of the transistor 1 and the ground terminal and the resistors 60, . . . , 6k, . . . , 6m connected between the emitter of the transistor 2 and the ground terminal as well as the number of the FETs 71, . . . , 7k, . . . , 7m are increased.

From the variable gain differential amplifiers according to the first to fifth embodiments, therefore, that having the optimum characteristics can be selected in accordance with the characteristics required to the variable gain differential amplifier.

Figure 7:
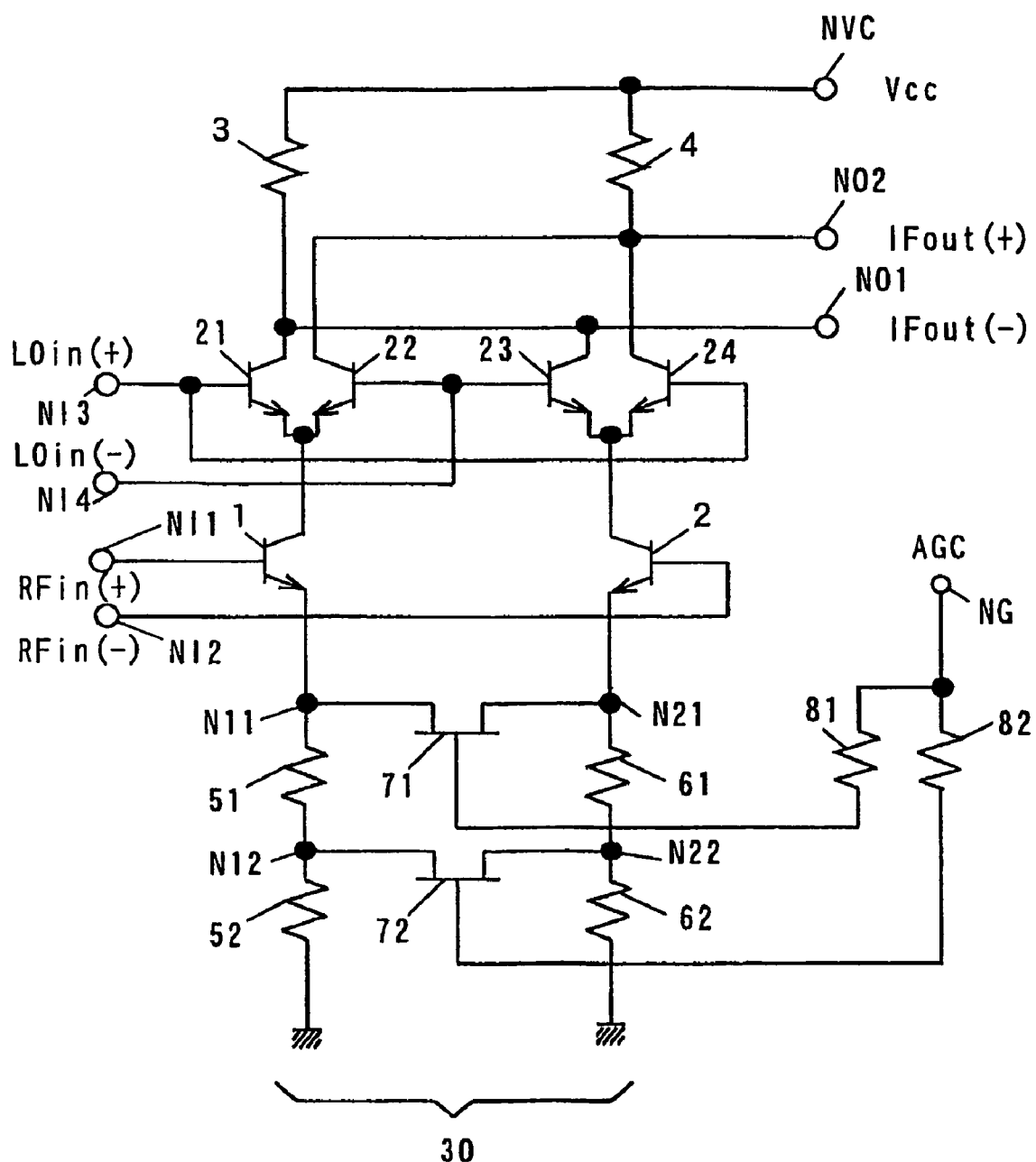
FIG. 7 is a circuit diagram showing the structure of a Gilbert-cell multiplication circuit according to a sixth embodiment of the present invention.

FIG. 7 is a circuit diagram showing the structure of a Gilbert-cell multiplication circuit (mixer) according to a sixth embodiment of the present invention.

The Gilbert-cell multiplication circuit (mixer) shown in FIG. 7 is formed by bipolar transistors (hereinafter simply referred to as transistors) 1, 2, 21, 22, 23 and 24, resistors 3, 4, 51, 52, 61, 62, 81 and 82 and n-MOSFETs(hereinafter simply referred to as FETs) 71 and 72. The resistors 3, 4, 51, 52, 61 and 62 serve as constant current sources. The resistors 51, 52, 61 and 62 and the FETs 71 and 72 form a variable resistance circuit 30.

The base of the transistor 1 is connected to an input terminal NI1 receiving an input signal RFin(+), and the base of the transistor 2 is connected to another input terminal NI2 receiving another input signal RFin(−). The input signals RFin(+) and RFin(−) are differential inputs. The transistors 21 and 22 are inserted between the collector of the transistor 1 and output terminals NO1 and NO2 respectively. The transistors 23 and 24 are inserted between the collector of the transistor 2 and the output terminals NO1 and NO2 respectively. The bases of the transistors 21 and 24 are connected to an input terminal NI3 receiving an input signal LOin(+), and the bases of the transistors 22 and 23 are connected to another input terminal NI4 receiving another input signal LOin(−). The input signals LOin(+) and LOin (−) are differential inputs. The collectors of the transistors 21 and 23 are connected to a power supply terminal NVC receiving a power supply voltage Vcc through the resistor 3. The collectors of the transistors 22 and 24 are connected to the power supply terminal NVC through the resistor 4.

The structures of the remaining parts of the Gilbert-cell multiplication circuit shown in FIG. 7 are similar to those of the variable gain differential amplifier shown in FIG. 1.

In this embodiment, the transistor 1 corresponds to the first transistor, the transistor 2 corresponds to the second transistor, the transistor 21 corresponds to the third transistor, the transistor 22 corresponds to the fourth transistor, the transistor 23 corresponds to the fifth transistor and the transistor 24 corresponds to the sixth transistor. The FETs 71 and 72 correspond to the variable impedance devices. The resistor 3 corresponds to the first load, the resistor 4 corresponds to the second load, the resistors 51 and 52 correspond to the first resistive elements, and the resistors 61 and 62 correspond to the second resistive elements. Further, the variable resistance circuit 30 corresponds to the variable impedance circuit.

It is assumed that a differential input signal RF is expressed as RFin(+)−RFin(−), another differential input signal LO is expressed as LOin(+)−LOin(−) and a differential output signal IF is expressed as IFout(+)−IFout(−). Assuming that $f_{RF}$ represents the frequency of the differential input signal RF, $f_{LO}$ represents the frequency of the differential input signal LO and $f_{IF}$ represents the frequency of the differential output signal IF, the following equation holds:

$$f_{IF}=f_{RF}\pm f_{LO}$$

Assuming that the frequency $f_{RF}$ of the differential input signal RF is 1.1 GHz and the frequency $f_{LO}$ of the differential input signal LO is 1 GHz, the frequency $f_{IF}$ of the differential output signal IF is 2.1 GHz or 100 MHz. When taking out the frequency $f_{IF}$ of 100 MHz, the Gilbert-cell multiplication circuit shown in FIG. 7 can serve as a down-converter.

In the Gilbert-cell multiplication circuit shown in FIG. 7, the gates of the FETs 71 and 72 are supplied with a common control voltage AGC, and hence the gate-to-source voltage and the gate-to-drain voltage of the FET 71 differ from those of the FET 72. This is equal to a state of supplying different control voltages to the gates of the FETs 71 and 72. When a control voltage at which nonlinearity is maximized is applied to the FET 71, therefore, it follows that a control voltage at which nonlinearity is reduced is applied to the FET 72. When a control voltage at which nonlinearity is maximized is applied to the FET 72, on the other hand, it follows that a control voltage at which nonlinearity is reduced is applied to the FET 71. Consequently, the distortion characteristic of the Gilbert-cell multiplication circuit at a specific level of the control voltage AGC is inhibited from abrupt deterioration when continuous gain control is performed by varying the control voltage AGC.

Thus, in the Gilbert-cell multiplication circuit according to this embodiment, distortion lower than a certain level can be achieved.

FIG. 8 is a circuit diagram showing the structure of a Gilbert-cell multiplication circuit according to a seventh embodiment of the present invention.

The Gilbert-cell multiplication circuit shown in FIG. 8 is different from that shown in FIG. 7 in a point that no resistors 52 and 62 are connected between a node NI2 and a ground terminal and between another node N22 and a ground terminal in a variable resistance circuit 30. The structures of the remaining parts of the Gilbert-cell multiplication circuit shown in FIG. 8 are similar to those of the Gilbert-cell multiplication circuit shown in FIG. 7.

Also in the Gilbert-cell multiplication circuit according to this embodiment, the distortion characteristic is improved over a wide region of the variable gain range. In particular, the difference between effective control voltages for two FETs 71 and 72 of the variable resistance circuit 30 can be so increased as to separate peak positions at which the distortion characteristic is deteriorated in the variable gain range.

Figure 9:
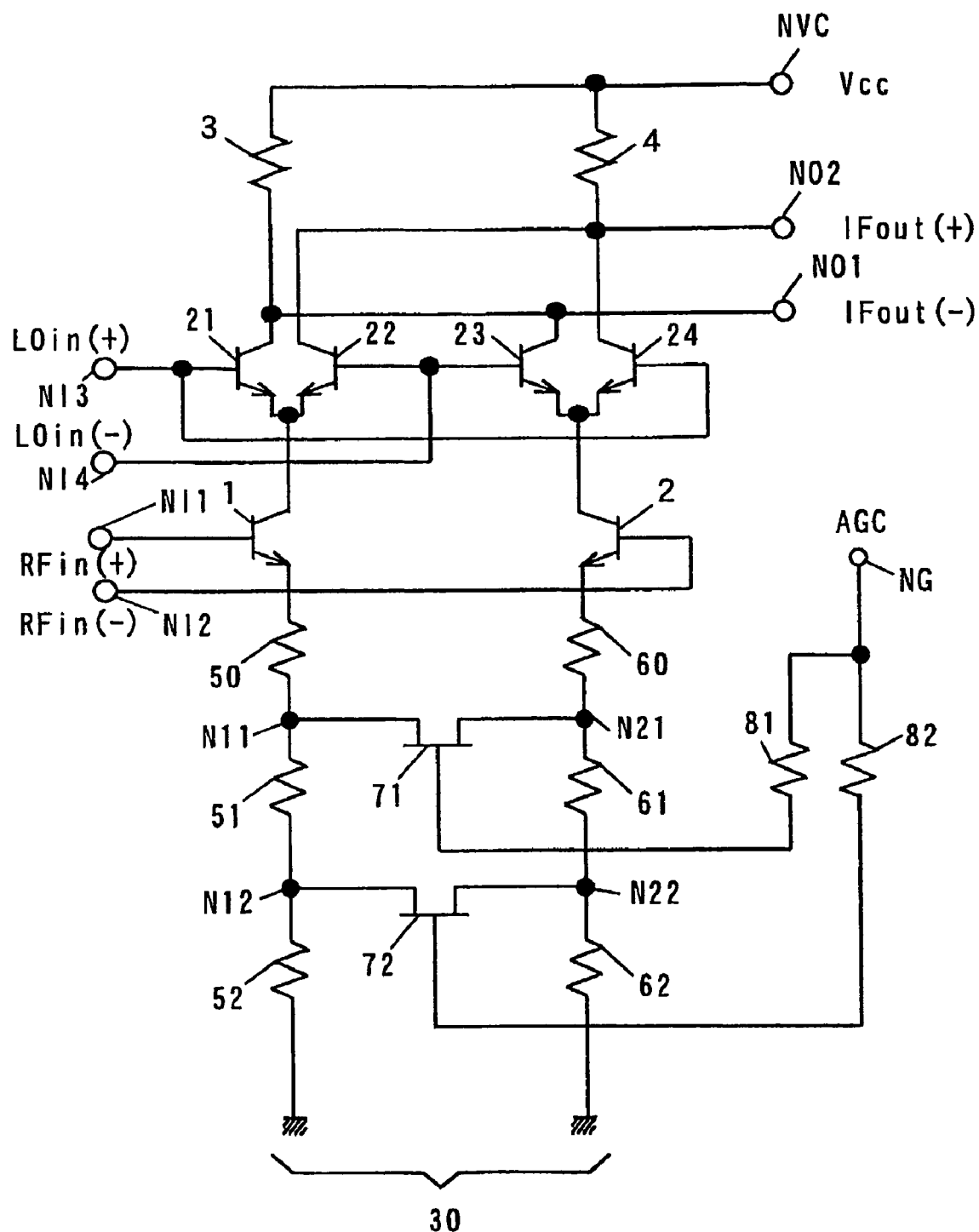
FIG. 9 is a circuit diagram showing the structure of a Gilbert-cell multiplication circuit according to an eighth embodiment of the present invention.

FIG. 9 is a circuit diagram showing the structure of a Gilbert-cell multiplication circuit according to an eighth embodiment of the present invention.

The Gilbert-cell multiplication circuit shown in FIG. 9 is different from that shown in FIG. 7 in a point that a resistor 50 is further connected between the emitter of a transistor 1 and a node N11 and another resistor 60 is further connected between the emitter of another transistor 2 and another node N21 in a variable resistance circuit 30. The structures of the remaining parts of the Gilbert-cell multiplication circuit shown in FIG. 9 are similar to those of the Gilbert-cell multiplication circuit shown in FIG. 7.

In the Gilbert-cell multiplication circuit according to this embodiment, distortion lower than a certain level can be achieved although the difference between effective control voltages for two FETs 71 and 72 of the variable resistance circuit 30 cannot be increased as compared with the Gilbert-cell multiplication circuit according to the seventh embodiment.

Figure 10:
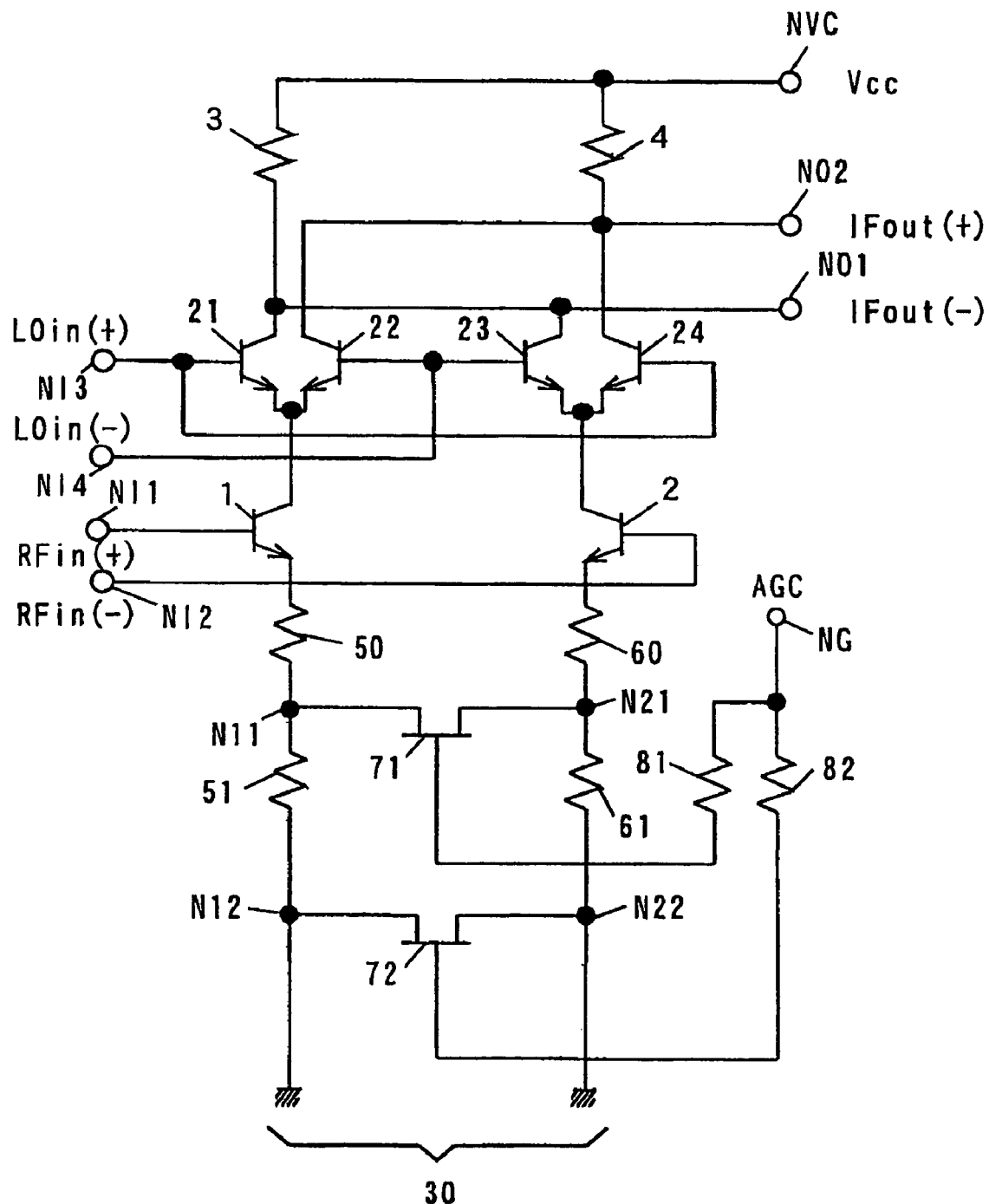
FIG. 10 is a circuit diagram showing the structure of a Gilbert-cell multiplication circuit according to a ninth embodiment of the present invention.

FIG. 10 is a circuit diagram showing the structure of a Gilbert-cell multiplication circuit according to a ninth embodiment of the present invention.

The Gilbert-cell multiplication circuit shown in FIG. 10 is different from that show in FIG. 7 in a point that a resistor 50 is connected between the emitter of a transistor 1 and a node N11, another resistor 60 is connected between the emitter of another transistor 2 and another node N21, and no resistors 52 and 62 are connected between a node N12 and a ground terminal and between another node N22 an a ground terminal. The structures of the remaining parts of the Gilbert-cell multiplication circuit shown in FIG. 10 are similar to those of the Gilbert-cell multiplication circuit shown in FIG. 7.

In the Gilbert-cell multiplication circuit according to this embodiment, the difference between effective control voltages for two FETs 71 and 72 of the variable resistance circuit 30 can be increased and distortion lower than a certain level can be achieved, although reduction of a noise factor is limited.

Figure 11:
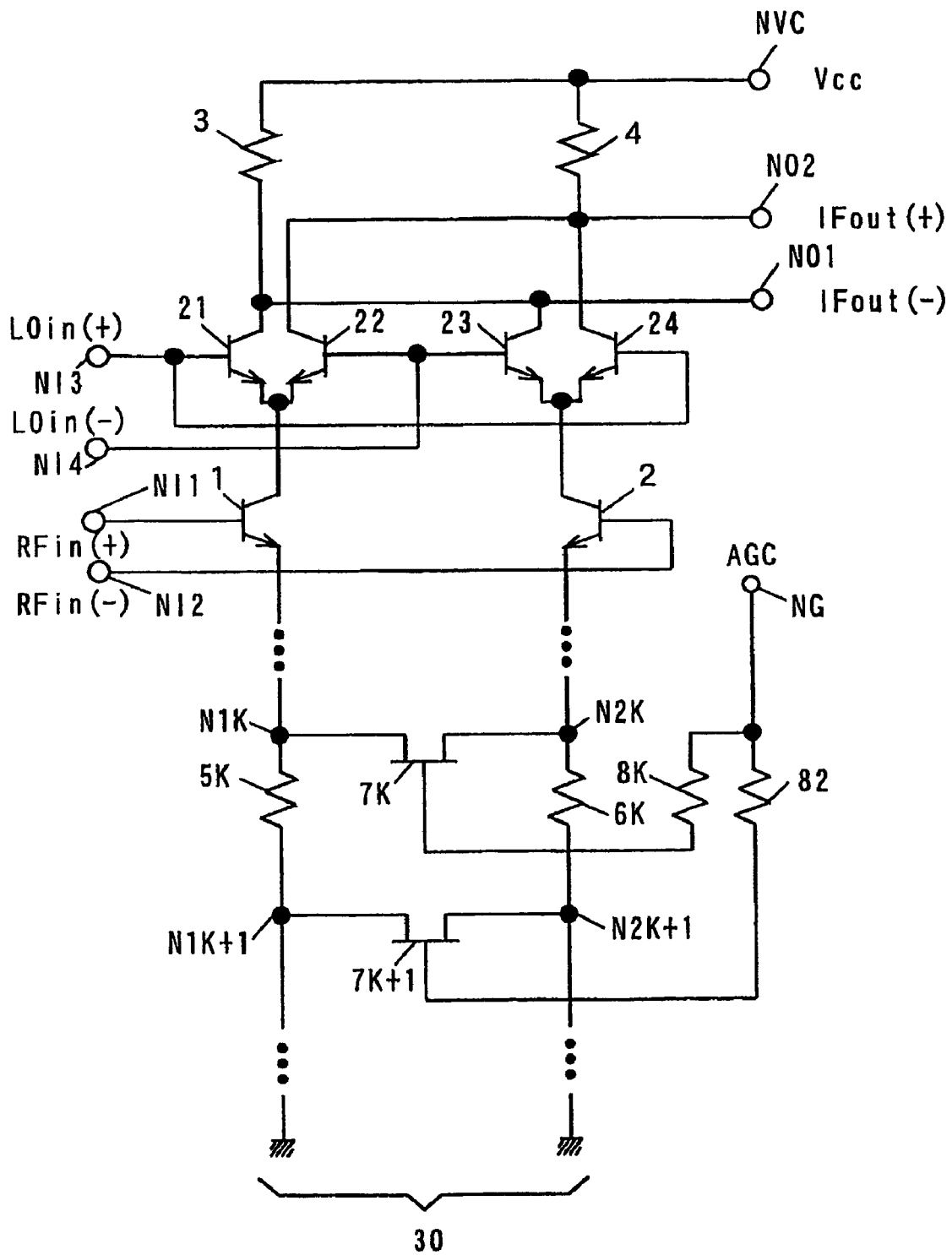
FIG. 11 is a circuit diagram showing the structure of a Gilbert-cell multiplication circuit according to a tenth embodiment of the present invention.

FIG. 11 is a circuit diagram showing the structure of a Gilbert-cell multiplication circuit according to a tenth embodiment of the present invention.

The Gilbert-cell multiplication circuit shown in FIG. 11 is different from that shown in FIG. 7 in a point that (m+1) resistors 50, ..., 5k, ..., 5m are serially connected between the emitter of a transistor 1 and a ground terminal, (m+1) resistors 60, ..., 6k, ..., 6m are serially connected between the emitter of a resistive transistor 2 and a ground terminal and FETs 71, ..., 7k, ..., 7m are connected between nodes N11, ..., N1k, ..., N1m between the resistors 50, ..., 5k, ..., 5m and nodes N21, ..., N2k, ..., N2m between the resistors 60, ..., 6k, ..., 6m respectively, where m represents an integer of at least 3. The gates of the FETs 71, ..., 7k, ..., 7m are connected to a control terminal NG receiving a control voltage AGC through resistors 81, ..., 8k, ..., 8m respectively. FIG. 11 shows only the resistors 5k, 6k, 8k and 8k+1 and the FETs 7k and 7k+1, where k represents 0, ..., m. The structures of the remaining parts of the Gilbert-cell multiplication circuit shown in FIG. 11 are similar to those of the Gilbert-cell multiplication circuit shown in FIG. 7.

Also in the Gilbert-cell multiplication circuit according to this embodiment, distortion lower than a certain level can be achieved.

As hereinabove described, each of the aforementioned embodiments implements a variable gain differential amplifier or a Gilbert-cell multiplication circuit having a low noise characteristic and a low distortion characteristic with a simple circuit structure by employing the variable resistance circuit 30.

In particular, the common control voltage AGC is applied to the FETs 71 and 72 (and 7k and 7k+1) of the variable resistance circuit 30, whereby gain control can be simply performed.

While each of the aforementioned embodiments employs bipolar transistors as the first to sixth transistors, other transistors such as MOSFETs or MESFETs (metal-electrode-semiconductor field-effect transistors) may alternatively be employed as the first to sixth transistors. The first to sixth variable impedance devices may have an impedance which changes continuously depending on a control voltage or may have two states of ON and OFF which are switched in response to a control voltage.

While each of the aforementioned embodiments employs the resistors 3 and 4 as the first and second loads, other elements such as MOSFETs, MESFETs, bipolar transistors, inductors or transformers may alternatively be employed as the first and second loads.

Figure 12:
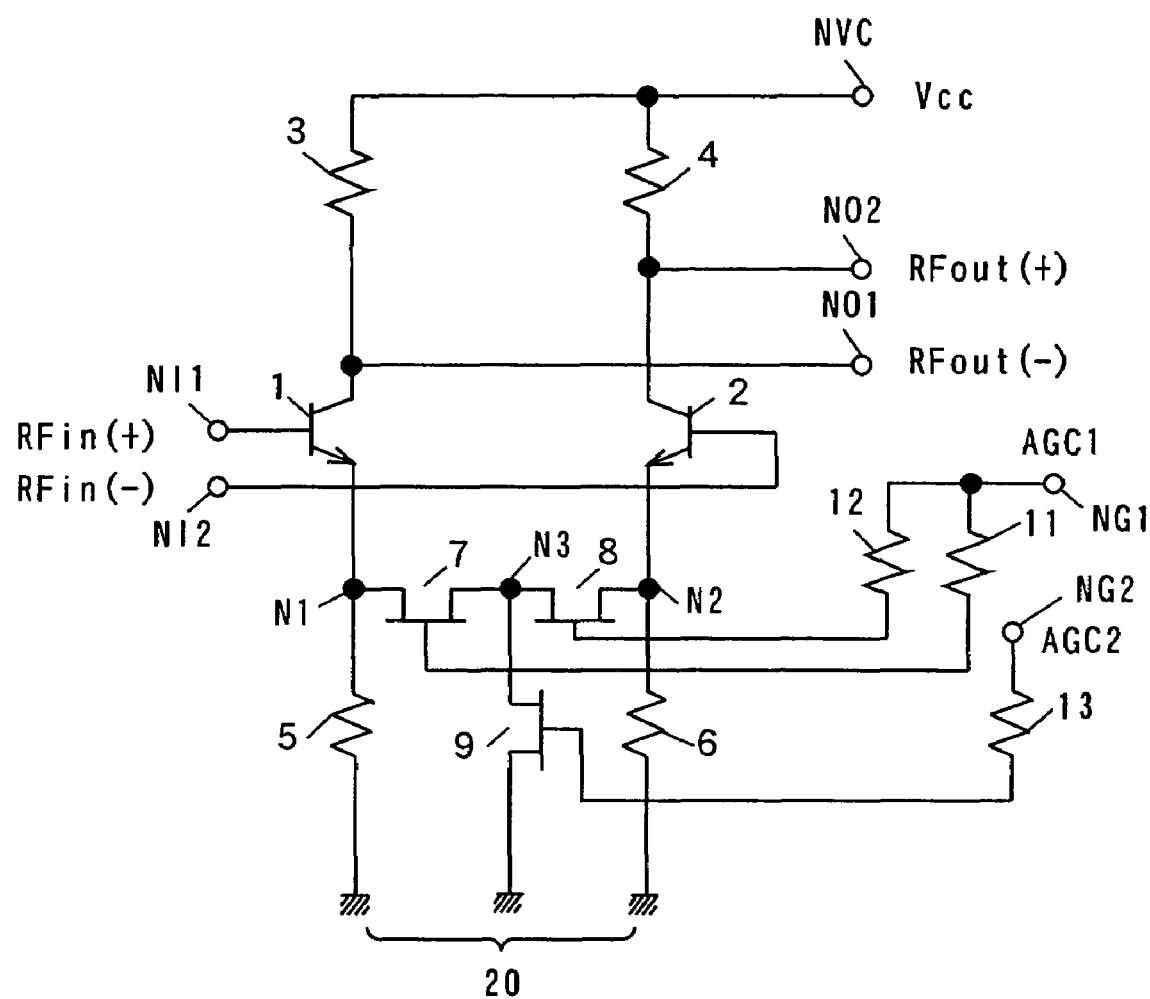
FIG. 12 is a circuit diagram showing the structure of a variable gain differential amplifier according to an eleventh embodiment of the present invention.

FIG. 12 is a circuit diagram showing the structure of a variable gain differential amplifier according to an eleventh embodiment of the present invention.

The variable gain differential amplifier shown in FIG. 12 is formed by bipolar transistors (hereinafter simply referred to as transistors) 1 and 2, resistors 3, 4, 5, 6, 11, 12 and 13 and n-MOSFETs (hereinafter simply referred to as FETs) 7, 8 and 9. The FETs 7, 8 and 9 form a variable resistance circuit 20. The resistors 3, 4, 5 and 6 serve as constant current sources.

The base of the transistor 1 is connected to an input terminal NI1 receiving an input signal RFin(+), and the base of the transistor 2 is connected to another input terminal NI2 receiving another input signal RFin(−). The input signals RFin(+) and RFin(−) are differential inputs. The collectors of the transistors 1 and 2 are connected to a power supply terminal NVC receiving a power supply voltage Vcc through the resistors 3 and 4 respectively. The emitters of the transistors 1 and 2 are connected to ground terminals through the resistors 5 and 6 respectively. The collectors of the transistors 1 and 2 are connected to output terminals NO1 and NO2 respectively. Output signals RFout(+) and RFout (−) are derived from the output terminals NO1 and NO2 respectively. The output signals RFout(+) and RFout(−) are differential outputs.

The two FETs 7 and 8 are serially connected between nodes N1 and N2 connected to the emitters of the transistors 1 and 2 respectively. The FET 9 is connected between a node N3 between the FETs 7 and 8 and a ground terminal.

The gates of the FETs 7 and 8 are connected to a control terminal NG1 receiving a control voltage AGC1 through the resistors 11 and 12 respectively. The gate of the FET 9 is connected to a control terminal NG2 receiving a control voltage AGC through the resistor 13. The control voltages AGC1 and AGC2 change complementarily to each other.

In this embodiment, the transistor 1 corresponds to the first transistor, the transistor 2 corresponds to the second transistor, the FETs 7 and 8 correspond to the first variable impedance devices, and the FET 9 corresponds to the second variable impedance device. The resistor 3 corresponds to the first load, the resistor 5 corresponds to the second load, the resistor 4 corresponds to the third load and the resistor 6 corresponds to the fourth load. Further, the variable resistance circuit 20 corresponds to the variable impedance circuit.

Figure 13:
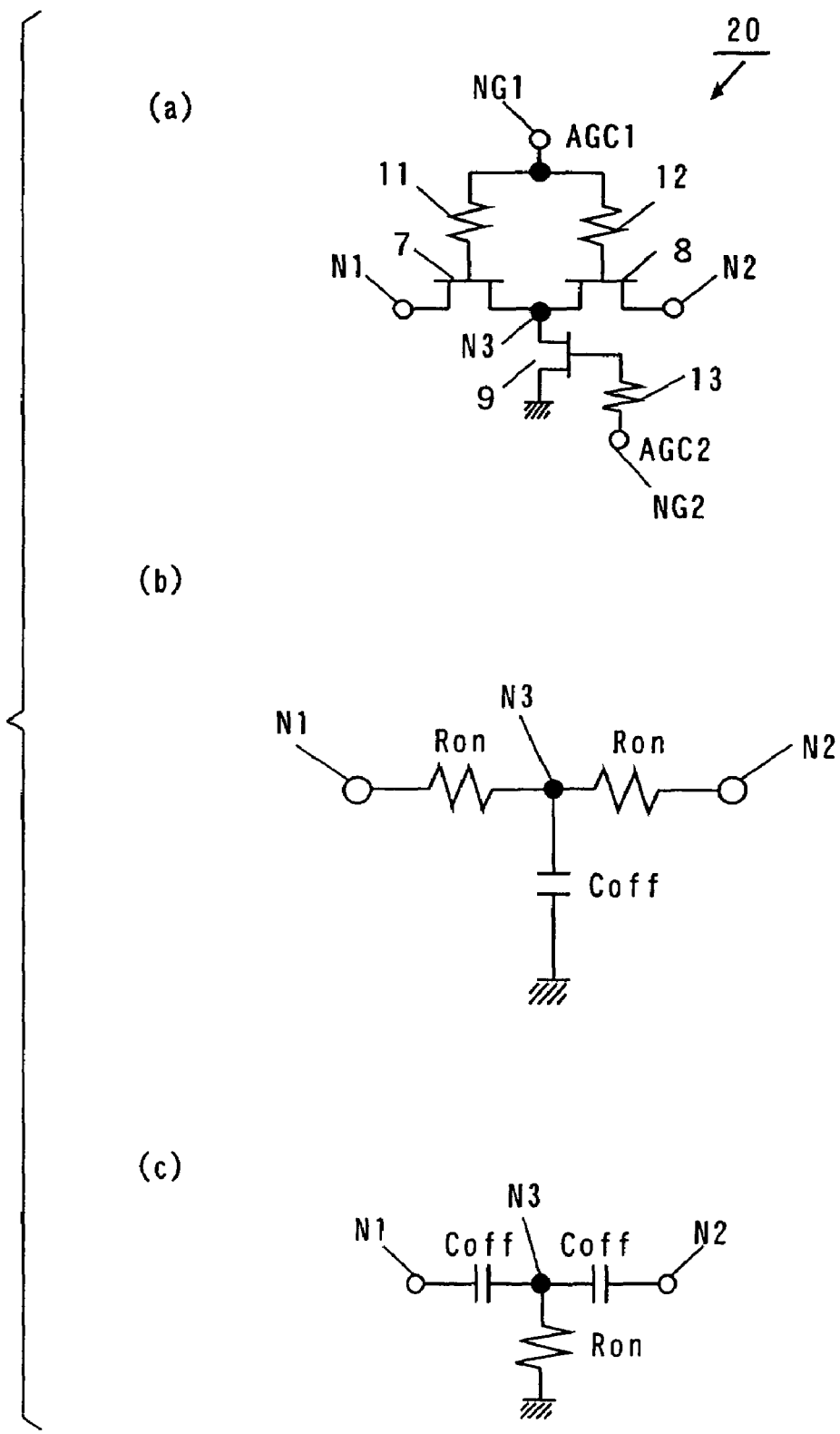
FIGS. 13(a) to 13(c) are diagrams for illustrating equivalent circuits of a variable resistance circuit shown in FIG. 12.

FIG. 13(*a*) is a circuit diagram of the variable resistance circuit 20, FIG. 13(*b*) is an equivalent circuit diagram of the variable resistance circuit with the FETs 7 and 8 in ON-states and the FET 9 in an OFF-state, and FIG. 13(*c*) is an equivalent circuit diagram of the variable resistance circuit 20 with the FETs 7 and 8 in OFF-states and the FET 9 in an ON-state.

It is assumed that Ron represents ON-state resistance of the FETs 7, 8 and 9 and Coff represents OFF-state capacitance of the FETs 7, 8 and 9.

The FETs 7 and 8 of the variable resistance circuit 20 are hereinafter referred to as series FETs 7 and 8, while the FET 9 is hereinafter referred to as a shunt FET 9.

When a small signal is input, the control voltages AGC1 and AGC2 are set high and low respectively, so that the series FETs 7 and 8 are turned on and the shunt FET 9 is turned off. The variable resistance circuit 20 is in an ON-state when the series FETs 7 and 8 are in ON-states and the shunt FET 9 is in an OFF-state. In this case, two ON-state resistances Ron are serially connected between the nodes N1 and N2, as shown in FIG. 13(*b*). Further, the OFF-state capacitance Coff is connected between a node N3 between the ON-state resistances Ron and a ground terminal. Thus, the impedance of the variable resistance circuit 20 is reduced. Consequently, a high gain and a low noise characteristic can be obtained.

When a large signal is input, the control voltages AGC1 and AGC2 are set low and high respectively, so that the series FETs 7 and 8 are turned off and the shunt FET 9 is turned on. The variable resistance circuit 20 is in an OFF state when the series FETs 7 and 8 are in OFF-states and the shunt FET 9 is in an ON-state. In this case, two OFF-state capacitances Coff are serially connected between the nodes N1 and N2, as shown in FIG. 13(*c*). Further, the ON-state resistance Ron is connected between the node N3 between the ON-state resistances Ron and the ground terminal. Thus, the impedance of the variable resistance circuit 20 is increased. Consequently, reduction of distortion can be achieved.

In this case, the ratio of the impedance of the variable resistance circuit 20 between the nodes N1 and N2 in the OFF-state to that in the ON-state is increased. Consequently, increase of the gain and reduction of the noise can be achieved when receiving a small signal while reduction of distortion can be achieved when receiving a large signal, also in a high-frequency domain.

In order to compare the impedance ratios in OFF-states and ON-states in the variable resistance circuit 20 shown in 15. FIGS. 13(*a*) to 13(*c*) and the variable resistance circuit 200 shown in FIGS. 21(*a*) to 21(*c*) with each other, levels of isolation and insertion loss were calculated.

The ON-state resistance Ron and the OFF-state capacitance Coff of FETs employed for the calculation were set to 2 Ωm and about 1 pF/mm respectively. A standard CMOS process was assumed for varying the gate width in the range of 10 $\mu$m to 100 $\mu$m. The calculation frequency was set to 1 GHz sufficiently influenced by the OFF-state capacitance Coff.

Figure 14:
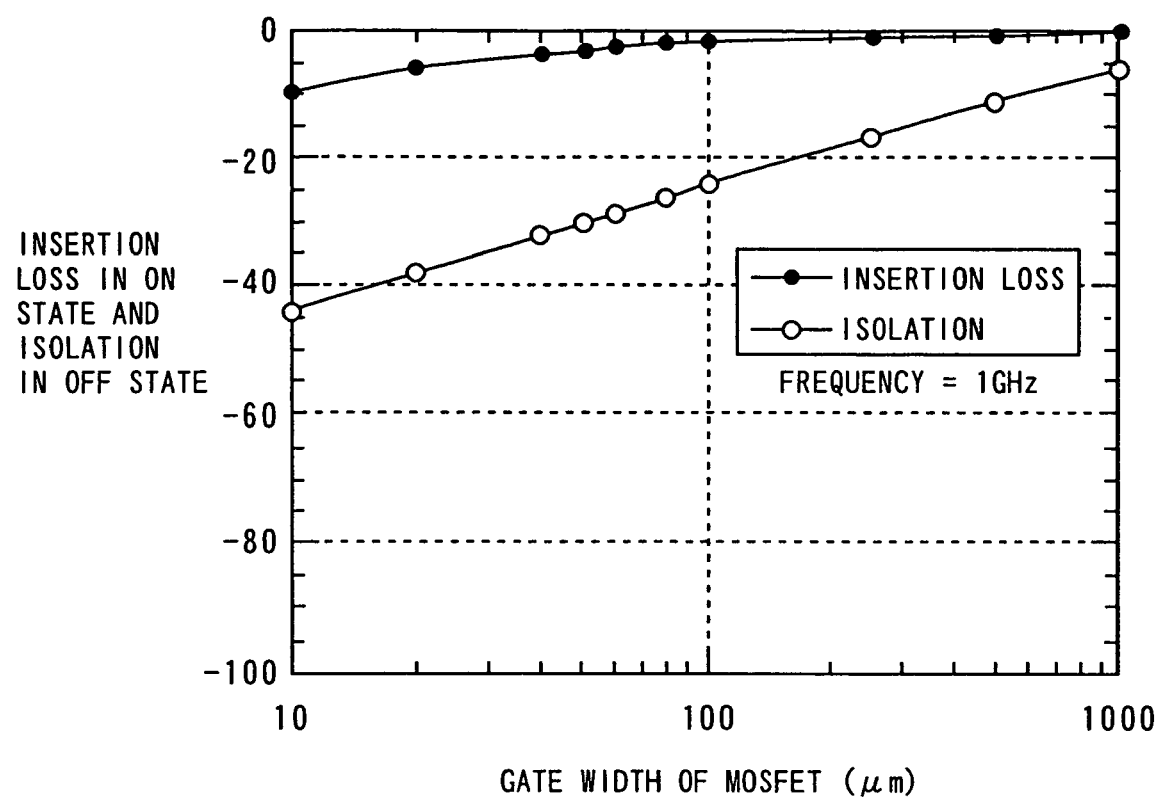
FIG. 14 illustrates the results of calculation of isolation and insertion loss of a variable resistance circuit shown in FIGS. 21(a) to 21(c)
Figure 15:
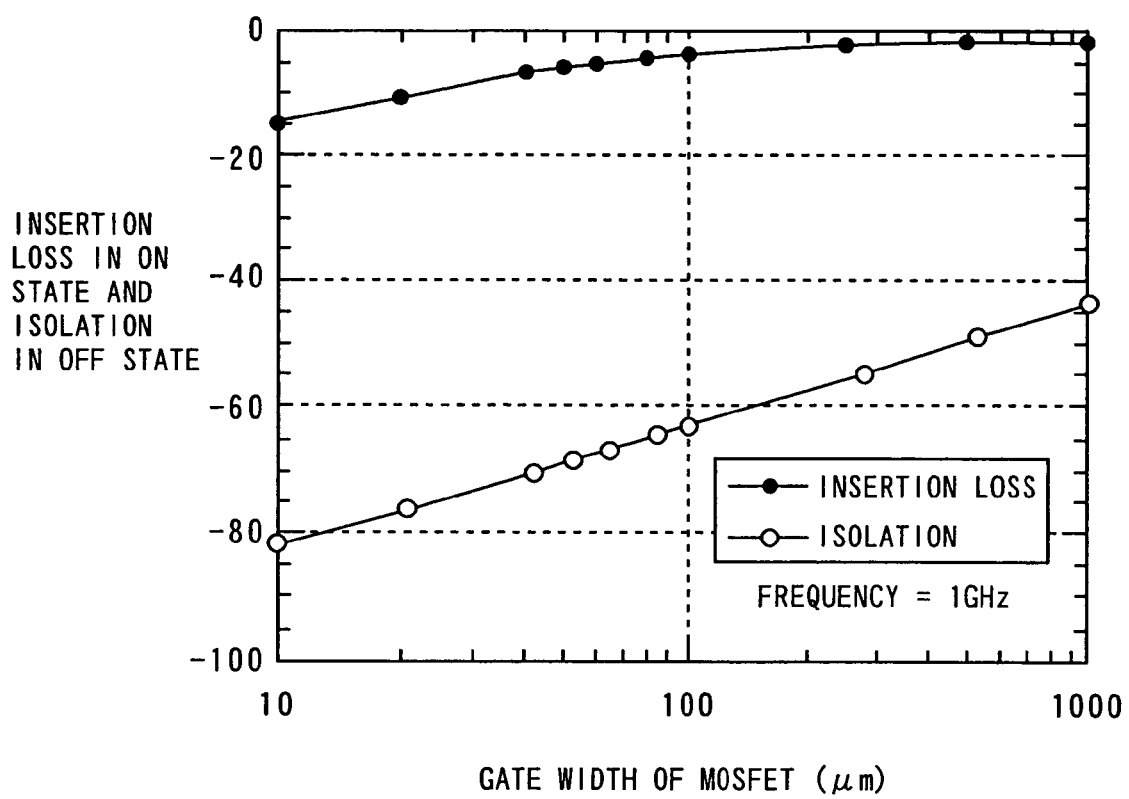
FIG. 15 illustrates the results of calculation of isolation and insertion loss of the variable resistance circuit shown in FIGS. 13(a) to 13(c)
Figure 21:
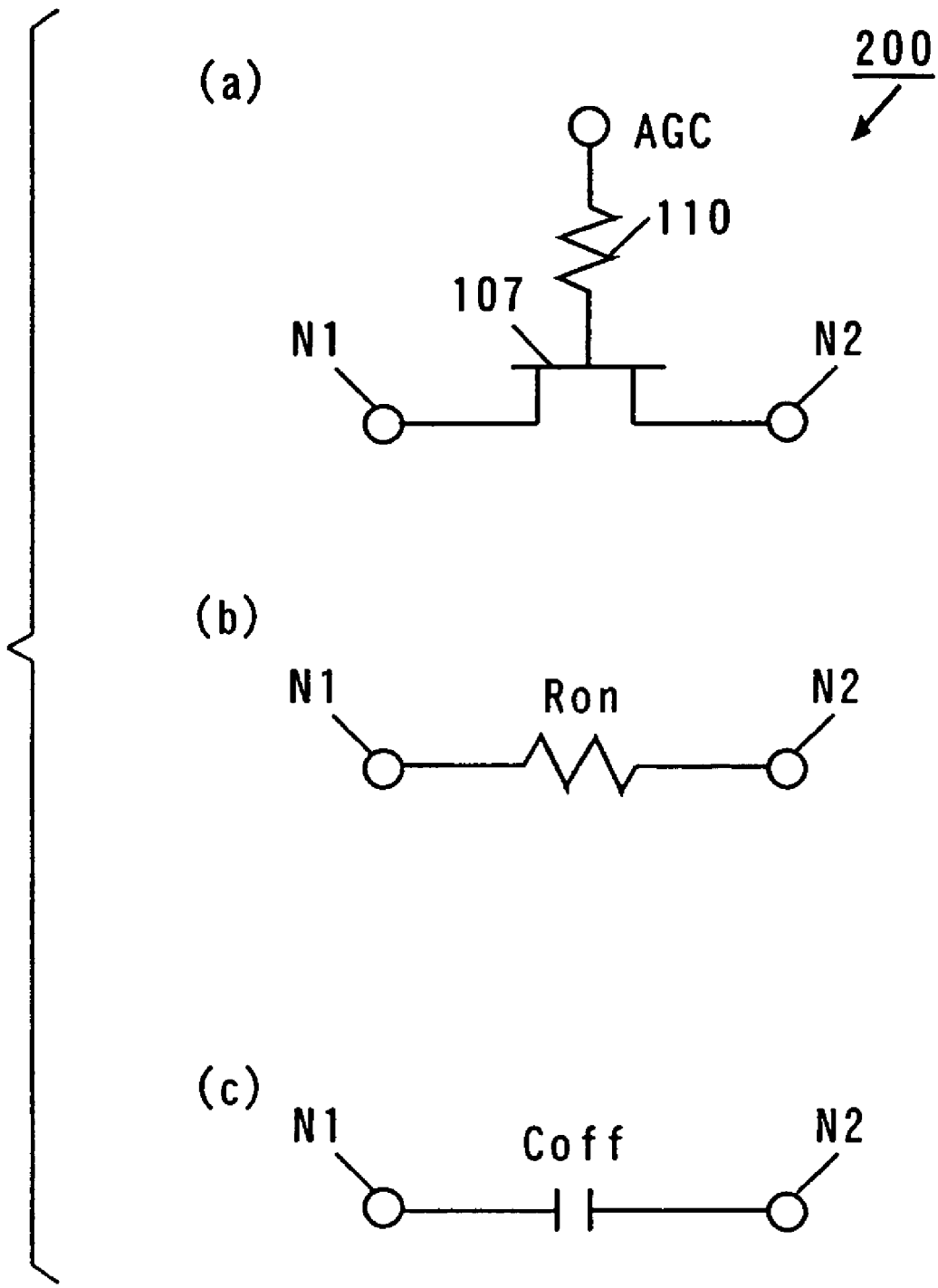
FIGS. 21(a) to 21(c) are diagrams for illustrating equivalent circuits of the variable resistance circuit show in FIG. 20.

FIG. 14 illustrates the results of calculation of isolation and insertion loss of the variable resistance circuit 200 shown in FIGS. 21(*a*) to 21(*c*). FIG. 15 illustrates the results of calculation of isolation and insertion loss of the variable resistance circuit 20 shown in FIGS. 13(*a*) to 13(*c*).

As shown in FIG. 15, the isolation in the OFF-state was improved by at least 30 dB in the variable resistance circuit 20 shown in FIGS. 13(*a*) to 13(*c*) as compared with the result, shown in FIG. 14, of the variable resistance circuit 200 shown in FIGS. 21(*a*) to 21(*c*) although the insertion loss in the ON-state was slightly deteriorated. Thus, the insertion loss in the ON-state can be reduced without reducing the isolation in the OFF-state by increasing the gate width of the FETs.

For example, by setting the emitters of the transistors 1 and 2 in the variable gain differential amplifier shown in FIG. 12 to a size suitable for reducing noise and by switching the control voltages AGC1 and AGC2 supplied to the gates of the series FETs 7 and 8 and the shunt FET 9 of the variable resistance circuit 20 to 3 V and 0 V respectively, the series FETs 7 and 8 and the shunt FET 9 are switched between ON- and OFF-states. When a small signal is input, the control voltages AGC1 and AGC2 are set to 3 V and 0 V respectively thereby turning on the series FETs 7 and 8 and turning off the shunt FET 9. When a large signal is input, the control voltages AGC1 an AGC2 are set to 0 V and 3 V respectively thereby turning off the series FETs 7 and 8 and turning on the shunt FET 9.

When the gate widths of the series FETs 7 and 8 and the shunt FET 9 are set to 250 $\mu$m in this case, for example, the impedance ratio between the ON- and OFF-states of the variable resistance circuit 20 is −1.298 dB/−54.2 dB. When the gate width of the FET 107 in the variable gain differential amplifier shown in FIG. 20 is set to 250 $\mu$m, on the other hand, the impedance ratio between the ON- and OFF-states of the variable resistance circuit 200 is −0.668 dB/−16.2 dB.

Thus, in the variable gain differential amplifier according to this embodiment, the impedance ratio between the OFF- and ON-states of the variable resistance circuit 20 is remarkably improved as compared with the variable resistance circuit 200 of the conventional variable gain differential amplifier shown in FIG. 20.

The impedance ratio between the OFF- and ON-states can be further improved by fixing the gate width of the series FETs 7 and 8 of the variable resistance circuit 20 and varying the gate width of the shunt FET 9.

Figure 16:
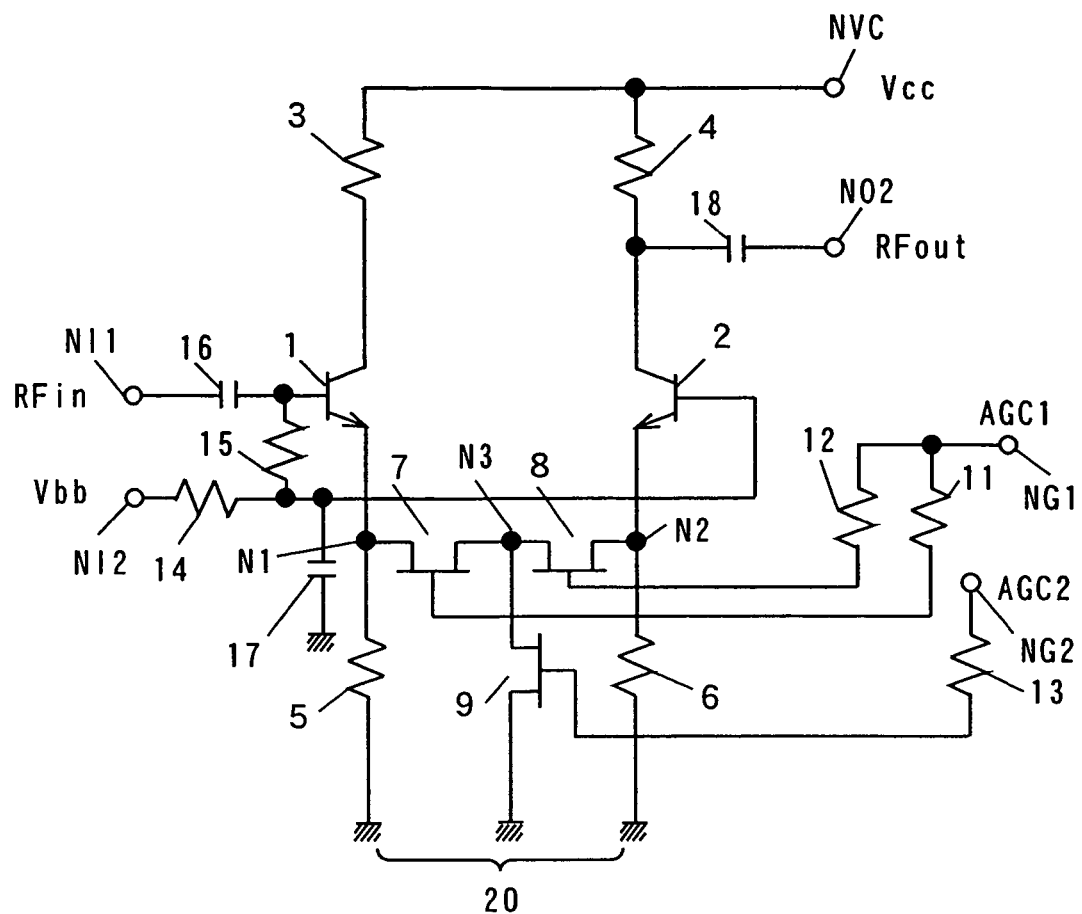
FIG. 16 is a circuit diagram showing the structure of a variable gain differential amplifier according to a twelfth embodiment of the present invention.

FIG. 16 is a circuit diagram showing the structure of a variable gain differential amplifier according to a twelfth embodiment of the present invention.

The variable gain differential amplifier shown in FIG. 16 further comprises resistors 14 and 15 and capacitors 16, 17 and 18 in addition to the structure in the variable gain differential amplifier shown in FIG. 12. The capacitor 16 is connected between an input terminal NI1 and the base of a transistor 1, and the resistor 14 is connected between another input terminal NI2 and the base of another transistor 2. The resistor 15 is connected between the bases of the transistors 1 and 2, and the base of the transistors 2 is grounded through the capacitor 17. The capacitor 18 is connected between the collector of the transistor 2 and an output terminal NO2. Thus, the input terminal NI2 is grounded in a high-frequency manner.

The structures of the remaining parts of the variable gain differential amplifier shown in FIG. 16 are similar to those of the variable gain differential amplifier show in FIG. 12.

In this embodiment, the resistors 14 and 15 and the capacitors 16 and 17 form an inversion circuit.

A unilateral ground input signal RFin is supplied to the input terminal NI1, and a dc bias Vbb is applied to the input terminal NI2. An inverted signal of the unilateral ground input signal RFin appears on the base of the transistor 2. A unilateral output signal RFout is derived from the output terminal NO2.

Also in the variable gain differential amplifier according to this embodiment, the ratio between the impedance in an OFF-state of a variable resistance circuit 20 between the nodes N1 and N2 to the impedance in an ON-state is increased similarly to the variable gain differential amplifier according to the eleventh embodiment. Consequently, increase of the gain and reduction of the noise can be achieved when receiving a small signal, and reduction of distortion can be achieved when receiving a large signal, also in a high-frequency domain.

Figure 17:
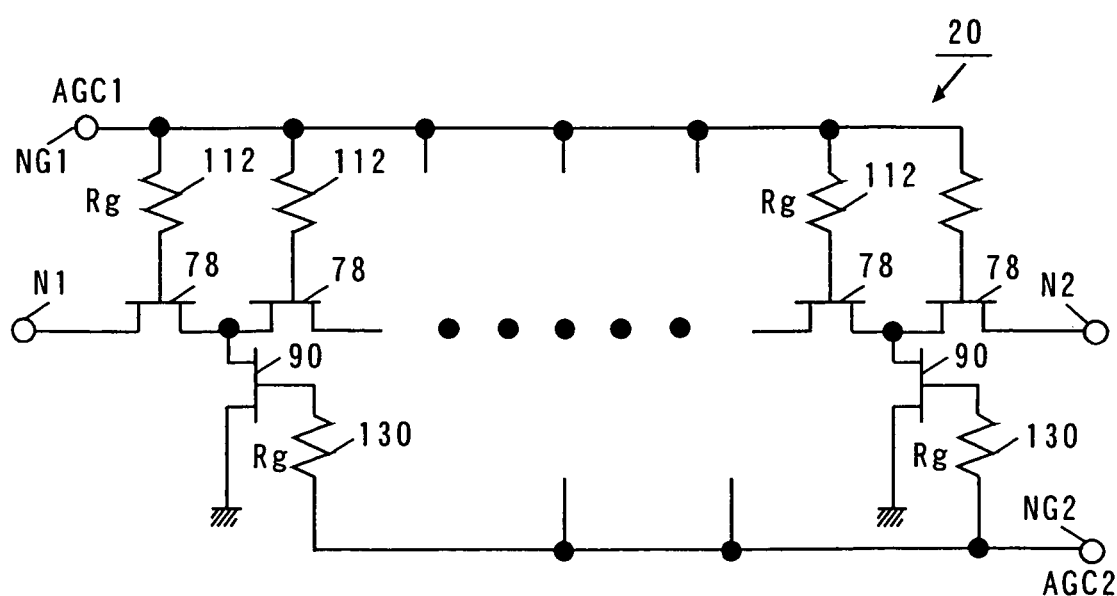
FIG. 17 illustrates another exemplary variable resistance circuit.

FIG. 17 is a circuit diagram showing another exemplary variable resistance circuit 20. The variable resistance circuit 20 shown in FIG. 17 is formed by m series FETs 78 and (m+1) shunt FETs 90, where m represents an integer of at least 3. The m series FETs 78 are serially connected between nodes N1 and N2. The (m+1) shunt FETs 90 are connected between nodes between the series FETs 78 and ground terminals respectively.

The gates of the series FETs 78 are connected to a control terminal NG1 receiving a control voltage AGC1 through resistors 112, and the gates of the shunt FETs 90 are connected to a control terminal NG2 receiving a control voltage AGC2 through resistors 130.

When a voltage exceeding the performance of each of the series FETs 7 and 8 of the variable resistance circuit 20 shown in FIG. 12 is applied between the source and the drain thereof, the output signals RFout(+) and RFout(−) are distorted. When the m series FETs 78 are serially connected between the nodes N1 and N2 as shown in FIG. 17, therefore, the voltage applied between the source and the drain of each FET 78 is reduced. Thus, further reduction of distortion can be achieved when receiving a large signal.

Figure 18:
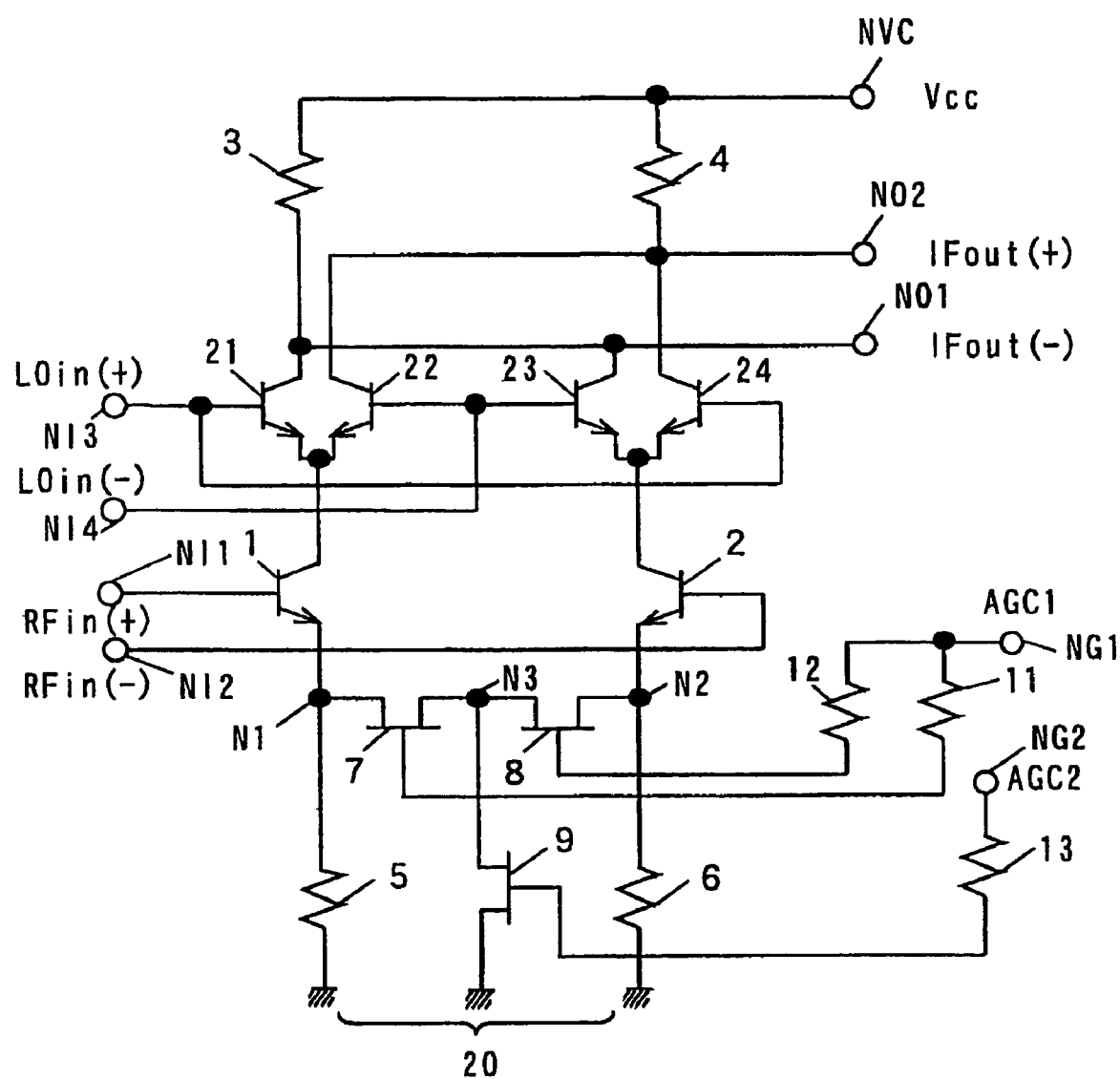
FIG. 18 is a circuit diagram showing the structure of a Gilbert-cell multiplication circuit according to a thirteenth embodiment of the present invention.

FIG. 18 is a circuit diagram showing the structure of a Gilbert-cell multiplication circuit (mixer) according to a thirteenth embodiment of the present invention.

The Gilbert-cell multiplication circuit shown in FIG. 18 is formed by bipolar transistors (hereinafter simply referred to as transistors) 1, 2, 21, 22, 23 and 24, resistors 3, 4, 5, 6, 11, 12 and 13 and n-MOSFETs (hereinafter simply referred to as FETs) 7, 8 and 9. The FETs 7, 8 and 9 form a variable resistance circuit 20. The resistors 3, 4, 5 and 6 serve as constant current sources.

The base of the transistor 1 is connected to an input terminal NI1 receiving an input signal RFin(+), and the base of the transistor 2 is connected to another input terminal NI2 receiving another input signal RFin(−). The input signals RFin(+) an RFin(−) are differential inputs. The transistors 21 and 22 are inserted between the collector of the transistor 1 and output terminals NO1 and NO2 respectively. The transistors 23 and 24 are inserted between the collector of the transistor 2 and the output terminals NO1 and NO2 respectively. The bases of the transistors 21 and 24 are connected to an input terminal NI3 receiving an input signal LOin(+), and the bases of the transistors 22 and 23 are connected to another input terminal NI4 receiving another input signal LOin(−). The input signals LOin(+) and LOin(−) are differential inputs. The collectors of the transistors 21 and 23 are connected to a power supply terminal NVC receiving a power supply voltage Vcc through the resistor 3. The collectors of the transistors 22 and 24 are connected to the power supply terminal NVC through the resistor 4.

The structures of the remaining parts of the Gilbert-cell multiplication circuit shown in FIG. 18 are identical to those of the variable gain differential amplifier shown in FIG. 16.

In this embodiment, the transistor 1 corresponds to the first transistor, the transistor 2 corresponds to the second transistor, the transistor 21 corresponds to the third transistor, the transistor 22 corresponds to the fourth transistor, the transistor 23 corresponds to the fifth transistor, and the transistor 24 corresponds to the sixth transistor. The FETs 7 and 8 correspond to the first variable impedance devices, and the FET 9 corresponds to the second variable impedance device. The resistor 3 corresponds to the first load, the resistor 5 corresponds to the second load, the resistor 4 corresponds to the third load, and the resistor 6 corresponds to the fourth load. Further, the variable resistance circuit 20 corresponds to the variable impedance circuit.

The FETs 7 and 8 of the variable resistance circuit 20 are hereinafter referred to as series FETs 7 and 8, and the FET 9 is referred to as a shunt FET 9.

It is assumed that a differential input signal RF is expressed as RFin(+)−RFin(−), another differential input signal LO is expressed as LOin(+)−LOin(−) and a differential output signal IF is expressed as IFout(+)−IFout(−). Assuming that $f_{RF}$ represents the frequency of the differential input signal RF, $f_{LO}$ represents the frequency of the differential input signal LO and $f_{IF}$ represents the frequency of the differential output signal IF, the following equation holds:

$$f_{IF}=f_{RF}\pm f_{LO}$$

Assuming that the frequency $f_{RF}$ of the differential input signal RF is 1.1 GHz and the frequency $f_{LO}$ of the differential input signal LO is 1 GHz, the frequency $f_{IF}$ of the differential output signal is 2.1 GHz or 100 MHz. When taking out the frequency $f_{IF}$ of 100 MHz, the Gilbert-cell multiplication circuit shown in FIG. 18 can serve as a down-converter.

In the Gilbert-cell multiplication circuit shown in FIG. 18, control voltages AGC1 and AGC2 high and low are set respectively when a small signal is input, thereby turning on the series FETs 7 and 8 and turning off the shunt FET 9. Thus, a high gain and a low noise characteristic can be achieved.

When a large signal is input, the control voltages AGC1 and AGC2 are set low and high respectively, thereby turning off the series FETs 7 and 8 and turning on the shunt FET 9. Thus, reduction of distortion can be achieved.

In this case, the ratio between the impedance in an OFF-state of the variable resistance circuit 20 between the nodes N1 and N2 to the impedance in an ON-state is increased. Consequently, increase of the gain and reduction of the noise can be achieved when receiving a small signal, and reduction of distortion can be achieved when receiving a large signal, also in a high-frequency domain.

Figure 19:
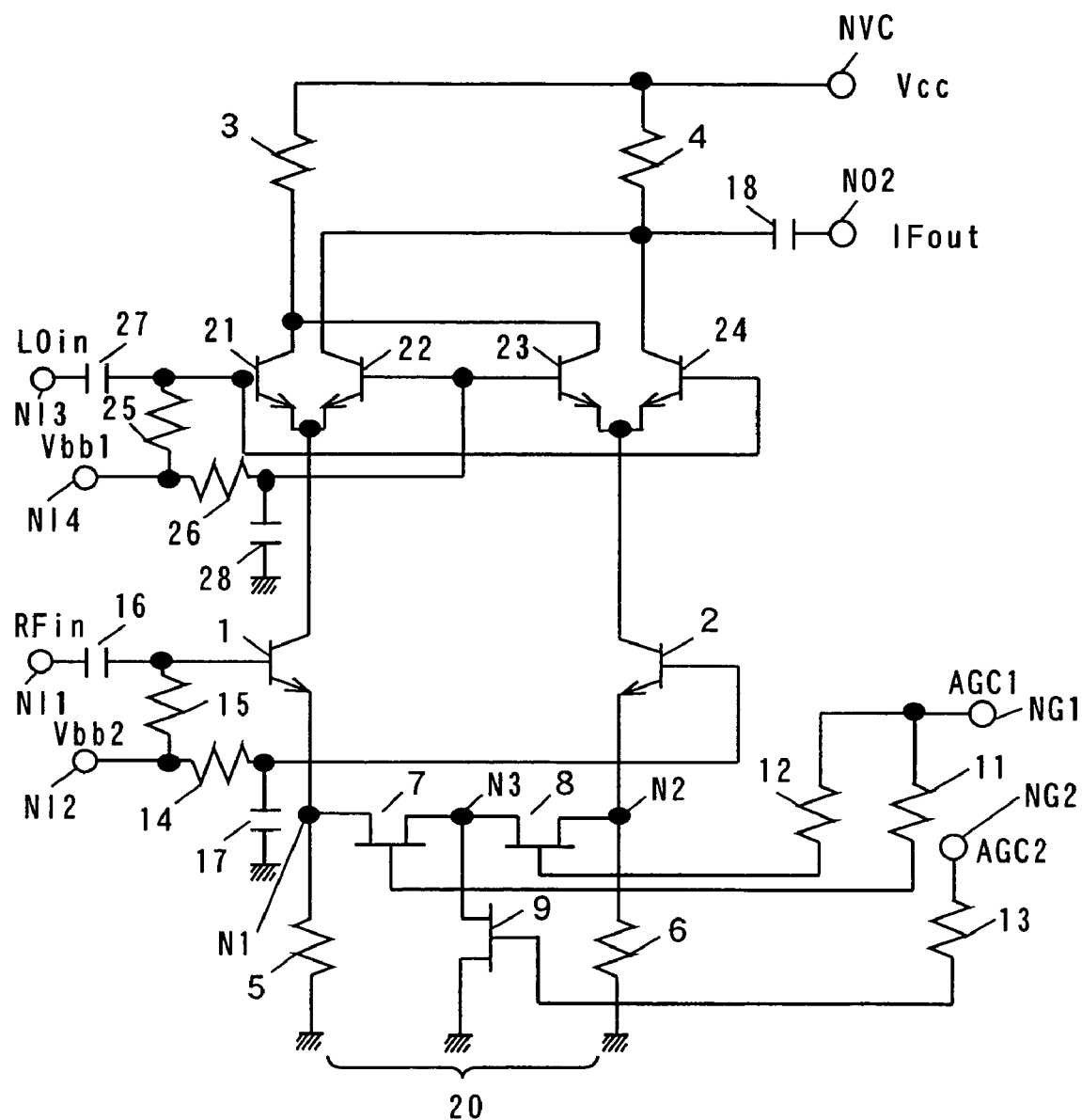
FIG. 19 is a circuit diagram showing the structure of a Gilbert-cell multiplication circuit according to a fourteenth embodiment of the present invention.

FIG. 19 is a circuit diagram showing the structure of a Gilbert-cell multiplication circuit (mixer) according to a fourteenth embodiment of the present invention.

The Gilbert-cell multiplication circuit shown in FIG. 19 further comprises resistors 14, 15, 25 and 26 and capacitors 16, 17, 18, 27 and 28 in addition to the structure in the Gilbert-cell multiplication circuit shown in FIG. 18.

The capacitor 16 is connected between an input terminal NI1 and the base of a transistor 1, and the resistor 14 is connected between another input terminal NI2 and the base of another transistor 2. The resistor 15 is connected between the base of the transistor 1 and the input terminal NI2, and the base of the transistor 2 is grounded through the capacitor 17. Thus, the input terminal NI2 is grounded in a high-frequency manner.

The capacitor 27 is connected between an input terminal NI3 and the bases of the transistors 21 and 24, and the resistor 26 is connected between another input terminal NI4 and the bases of the transistors 22 and 23. The resistor 25 is connected between the bases of the transistors 21 and 24 and the input terminal NI4, and the bases of the transistors 22 and 23 are grounded through the capacitor 28. Thus, the input terminal NI4 is grounded in a high-frequency manner.

The capacitor 8 is connected between the collectors of the transistors 22 and 24 and the output terminal NO2.

The structures of the remaining parts of the Gilbert-cell multiplication circuit shown in FIG. 19 are similar to those of the Gilbert-cell multiplication circuit show in FIG. 18.

In this embodiment, the resistors 14 and 15 and the capacitors 16 and 17 form a first inversion circuit, while the resistors 25 and 26 and the capacitors 27 and 28 form a second insertion circuit.

A unilateral ground input signal RFin is supplied to the input terminal NI1, and a dc bias Vbb2 is applied to the input terminal NI2. An inverted signal of the unilateral ground input signal RFin appears on the base of the transistor 2. A unilateral ground input signal LOin is supplied to the input terminal NI3, and a dc bias Vbb1 is applied to the input terminal NI4. An inverted signal of the unilateral ground input signal LOin appears on the bases of the transistors 22 and 23.

A unilateral output signal IFout indicating the result of multiplication of the unilateral ground input signals RFin and LOin is derived from the output terminal NO2.

Also in the Gilbert-cell multiplication circuit according to this embodiment, the ratio of the impedance in an OFF-state of a variable resistance circuit 20 between nodes N1 and N2 to the impedance in an ON-state is increased similarly to the Gilbert-cell multiplication circuit according to the thirteenth embodiment. Consequently, increase of the gain and reduction of noise can be achieved when receiving a small signal, and reduction of distortion can be reduced when receiving a large signal, also in a high-frequency domain.

In the Gilbert-cell multiplication circuit shown in each of FIGS. 18 and 19, the variable resistance circuit 20 shown in FIG. 17 may be employed. Thus, further reduction of distortion can be achieved when receiving a large signal.

While each of the aforementioned embodiments employs bipolar transistors as the first to sixth transistors, other transistors such as MOSFETs or MESFETs (metal-electrode-semiconductor field-effect transistors) may alternatively be employed as the first to sixth transistors. The first to sixth variable impedance devices may have an impedance which changes continuously depending on a control voltage or may have two states of ON and OFF which are switched in response to a control voltage.

While each of the aforementioned embodiments employs the resistors 3 to 6 as the first to fourth loads, other elements such as MOSFETs, MESFETs, bipolar transistors, inductors or transformers may alternatively be employed as the first to fourth loads.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A multiplication circuit comprising:

first, second, third, fourth, fifth and sixth transistors each having a first terminal, a second terminal and a third terminal; and a variable impedance circuit, wherein said first terminal of said first transistor receives a first input signal, said second terminal of said first transistor is connected to a first potential through a first load and said third terminal of said first transistor is connected to said second terminal of said fifth transistor, said first terminal of said second transistor receives a second input signal, said second terminal of said second transistor is connected to said first potential through a second load and said third terminal of said second transistor is connected to said second terminal of said fifth transistor, said first terminal of said third transistor receives said second input signal, said second terminal of said third transistor is connected to said first potential through said first load and said third terminal of said third transistor is connected to said second terminal of said sixth transistor, said first terminal of said fourth transistor receives said first input signal, said second terminal of said fourth transistor is connected to said first potential through said second load and said third terminal of said fourth transistor is connected to said second terminal of said sixth transistor, said first terminal of said fifth transistor receives a third input signal and said third terminal of said fifth transistor is connected to a second potential through a third load, said first terminal of said sixth transistor receives a fourth input signal and said third terminal of said sixth transistor is connected to said second potential through a fourth load, and said variable impedance circuit includes:

a plurality of first variable impedance devices serially connected between said third terminal of said fifth transistor and said third terminal of said sixth transistor, and at least one second variable impedance device that is connected between a node between said plurality of first variable impedance devices and said second potential and is turned on/off complementarily to said plurality of first variable impedance devices.

2. The multiplication circuit according to claim 1, further comprising an output terminal connected said second terminals of said second and fourth transistors for deriving an output signal.

3. The multiplication circuit according to claim 1, further comprising:
- a first output terminal connected to said second terminals of said first and third transistors for deriving a first output signal, and
- a second output terminal connected to said second terminals of said second and fourth transistors for deriving a second output signal.

4. The multiplication circuit according to claim 1, further comprising:
- a first input terminal receiving said first input signal for supplying said first input signal to said first terminals of said first and fourth transistors,
- a first inversion circuit that inverts said first input signal from said first input terminal for supplying the inverted first input signal to said first terminals of said second and third transistors as said second input signal,
- a second input terminal receiving said third input signal for supplying said third input signal to said first terminal of said fifth transistor, and
- a second inversion circuit that inverts said third input signal from said second input terminal for supplying the inverted third input signal to said first terminal of said sixth transistor as said fourth input signal.

* * * * *